US012787870B2

(12) United States Patent
Liu et al.

(10) Patent No.: US 12,787,870 B2
(45) Date of Patent: Nov. 3, 2026

(54) ELECTRONIC DEVICE

(71) Applicant: Advanced Semiconductor Engineering, Inc., Kaohsiung (TW)

(72) Inventors: Syu-Tang Liu, Kaohsiung (TW); Pao-Nan Lee, Kaohsiung (TW); Yu-Hsun Chang, Kaohsiung (TW); Jung Jui Kang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 524 days.

(21) Appl. No.: 18/212,155

(22) Filed: Jun. 20, 2023

(65) Prior Publication Data

US 2024/0429213 A1 Dec. 26, 2024

(51) Int. Cl.

| | |
|---|---|
| ***H01L 25/10*** | (2006.01) |
| ***H10W 44/00*** | (2026.01) |
| ***H10W 70/65*** | (2026.01) |
| ***H10W 74/10*** | (2026.01) |
| ***H10W 90/00*** | (2026.01) |
| *H10W 70/60* | (2026.01) |
| *H10W 72/00* | (2026.01) |
| *H10W 72/20* | (2026.01) |
| *H10W 80/00* | (2026.01) |

(52) U.S. Cl.

CPC ........... *H10W 90/00* (2026.01); *H10W 44/00* (2026.01); *H10W 70/65* (2026.01); *H10W 74/111* (2026.01); *H10W 90/701* (2026.01); *H10W 70/60* (2026.01); *H10W 72/07253* (2026.01); *H10W 72/237* (2026.01); *H10W 80/312* (2026.01); *H10W 90/722* (2026.01); *H10W 90/724* (2026.01); *H10W 90/794* (2026.01)

(58) Field of Classification Search

None

See application file for complete search history.

(56) References Cited

U.S. PATENT DOCUMENTS

| | | | | |
|---|---|---|---|---|
| 11,462,463 | B2 * | 10/2022 | Elsherbini | G05F 1/46 |
| 12,283,560 | B2 * | 4/2025 | Kao | H10W 70/09 |
| 2021/0280523 | A1 * | 9/2021 | We | H10W 70/09 |
| 2022/0359324 | A1 * | 11/2022 | Lin | H10W 20/427 |
| 2023/0009219 | A1 * | 1/2023 | Tien | H10W 70/685 |
| 2023/0065615 | A1 * | 3/2023 | Kung | H10W 70/635 |

OTHER PUBLICATIONS

U.S. Appl. No. 17/669,231, filed Feb. 10, 2022, Lee et al.

* cited by examiner

*Primary Examiner* — Long Pham

(74) *Attorney, Agent, or Firm* — Foley & Lardner LLP

(57) ABSTRACT

An electronic device is provided. The electronic device includes a package structure and a power regulating element. The package structure includes an electronic component, a plurality of first conductive structures, and an encapsulant. The plurality of first conductive structures are connected to the electronic component. The encapsulant encapsulates the electronic component and exposes a portion of the plurality of first conductive structures. The power regulating component includes a plurality of second conductive structures directly bonded with the plurality of first conductive structures and configured to provide the electronic component with a power signal.

17 Claims, 25 Drawing Sheets

ELECTRONIC DEVICE

BACKGROUND

1. Field of the Disclosure

The present disclosure relates to an electronic device, in particular to an electronic device including an electronic component bonded to a package structure.

2. Description of the Related Art

A solder joint may be utilized to bond different components, such as an electronic component and a package structure. However, when the size of an electronic device is reduced. It is difficult to control the amount of solder material. Therefore, a solder cracking and/or solder bridging may occur, which reduces the manufacturing yield for an electronic device. In order to provide the desired enhancement in performance, a new electronic device is required.

SUMMARY

In some embodiments, an electronic device includes a package structure and a power regulating element. The package structure includes an electronic component, a plurality of first conductive structures, and an encapsulant. The plurality of first conductive structures are connected to the electronic component. The encapsulant encapsulates the electronic component and exposes a portion of the plurality of first conductive structures. The power regulating component includes a plurality of second conductive structures directly bonded with the plurality of first conductive structures and configured to provide the electronic component with a power signal.

In some embodiments, an electronic device includes a package structure and an integrated circuit. The package structure includes an encapsulant, an electronic component, and a first conductive element. The electronic component is encapsulated by the encapsulant. The first conductive element is exposed by the encapsulant. The integrated circuit includes a second conductive element connected to the first conductive element through a non-solder joint.

In some embodiments, an electronic device includes a package structure and a second electronic component. The package structure includes an electronic component, a first conductive structure, and a second conductive structure. The first conductive structure is disposed over the electronic component. The second conductive structure is disposed adjacent to a lateral surface of the electronic component. The second electronic component includes a plurality of third conductive structures directly connected to the first conductive structure and the second conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

Figure 1:
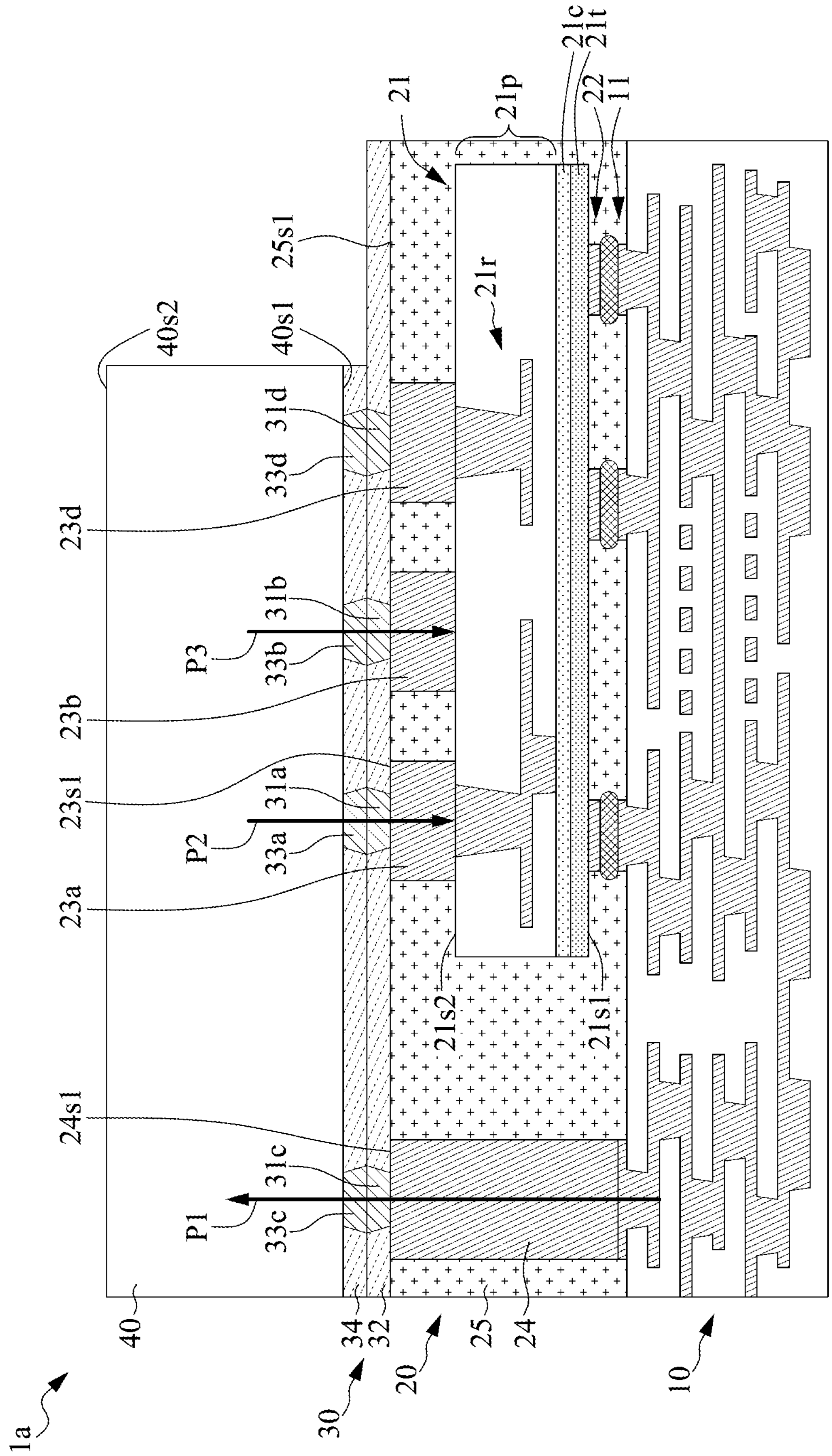
FIG. 1 illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides many different arrangements, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include arrangements in which the first and second features are formed or disposed in direct contact, and may also include arrangements in which one or more additional features may be formed or disposed between the first and second features, such that the first and second features may not be in direct contact. In addition, the present disclosure may repeat reference numerals and/or letters in the various examples. The same reference numerals and/or letters refer to the same or similar parts. This repetition is for the purpose of simplicity and clarity and does not in itself dictate a relationship between the various arrangements and/or configurations.

Arrangements of the present disclosure are discussed in detail as follows. It should be appreciated, however, that the present disclosure provides many applicable concepts that can be embodied in a wide variety of specific contexts. The specific arrangements discussed are merely illustrative and do not limit the scope of the disclosure.

FIG. 1 illustrates a cross-sectional view of an example of an electronic device 1*a* according to some embodiments of the present disclosure. In some embodiments, the electronic device 1*a* may include a carrier 10, a package structure 20, a bonding structure 30, and an electronic component 40.

In some embodiments, the carrier 10 (or a circuit structure) may include a circuit board, such as a paper-based copper foil laminate, a composite copper foil laminate, or a polymer-impregnated glass-fiber-based copper foil laminate. The carrier 10 may include at least one dielectric layer and a redistribution structure, trace, and/or circuit within the dielectric layer. In some embodiments, the carrier 10 may be electrically connected to a power source (not shown), and the carrier 10 may be included in a transmission path for providing an electronic component(s) or a device with power. In some embodiments, conductive terminals (not shown) may be disposed on or disposed under the lower surface (not annotated) of the carrier 10, which may be configured to electrically connect to an external device.

Electrical connections 11 may be disposed on or disposed over an upper surface (not annotated) of the carrier 10. The electrical connection 11 may include, for example, a conductive pad, a solder element, and/or other suitable elements. The conductive pad may include a conductive material(s), such as copper (Cu), aluminum (Al), tungsten (W), titanium (Ti), tantalum (Ta), or other applicable materials. The solder element may include alloys of gold and tin solder or alloys of silver and tin solder, or other suitable materials.

The package structure 20 may be disposed on or disposed over the upper surface of the carrier 10. In some embodiments, the package structure 20 may include an electronic component 21, electrical connections 22, conductive elements 23*a*, 23*b*, 23*d*, and 24, as well as an encapsulant 25.

The electronic component 21 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 21 may include a system on chip (SoC). For example, the electronic component 21 may include an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC. The electronic component 21 may have a surface 21*s*1 and a surface 21*s*2 opposite to the surface 21*s*1. The surface 21*s*1 of the electronic component 21 may face the carrier 10. The surface 21*s*1 may function as an active surface, and the surface 21*s*2 may function as a backside surface. In some embodiments, signal may be transmitted from the electronic component 21 to an external device through the surface 21*s*1. In some embodiments, at least a portion of power may be transmitted to the electronic component 21 through the surface 21*s*2.

The electronic component 21 may be electrically connected to the carrier 10 by the electrical connection 22 and the electrical connection 11. The electrical connection 22 may be disposed on or disposed under the surface 21*s*1 of the electronic component 21. The electrical connection 22 may include, for example, a conductive pad or other suitable elements. The electrical connection 22 may include a conductive material(s), such as copper (Cu), aluminum (Al), tungsten (W), titanium (Ti), tantalum (Ta), or other applicable materials.

In some embodiments, the electronic component 21 may include a redistribution structure 21*r*, which extends to the surface 21*s*2 of the electronic component 21. In some embodiments, the redistribution structure 21*r* may be configured to transmit power to the IC(s) of the electronic component 21. In some embodiments, the redistribution structure 21*r* may be configured to transmit heat to the outside. The redistribution structure 21*r* may include at least one conductive trace, and/or conductive via embedded within a dielectric layer(s) or the semiconductor substrate (e.g., a silicon substrate) of the electronic component 21.

In some embodiments, the electronic component 21 may include a redistribution circuit 21*t*, a logic circuit 21*c*, and a power delivery circuit 21*p*. The redistribution circuit 21*t* is disposed adjacent to the surface 21*s*1. The power delivery circuit 21*p* is disposed adjacent to the surface 21*s*2. The power delivery circuit 21*p* may include the redistribution structure 21*r*. The logic circuit 21*c* may receive a power (or a power signal) through the power delivery circuit 21*p*.

The conductive elements 23*a*, 23*b*, and 23*d* may be disposed on or disposed over the surface 21*s*2 of the electronic component 21. The conductive elements 23*a*, 23*b*, and 23*d* may be electrically connected to the electronic component 21. Each of the conductive elements 23*a*, 23*b*, and 23*d* may include a conductive pillar, conductive via, or other suitable components. In some embodiments, the conductive element 23*a* may be configured to provide a path for transmitting power. In some embodiments, the conductive element 23*b* may provide a path connected to ground. For example, a grounding signal may be transmitted by the conductive element 23*b*. The conductive elements 23*a* and 23*b* may include a conductive material(s), such as copper (Cu), aluminum (Al), tungsten (W), titanium (Ti), tantalum (Ta), or other applicable materials.

The conductive element 24 may extend from the upper surface of the carrier 10. The conductive element 24 may be disposed at or adjacent to the side (or a lateral side surface) of the electronic component 21. In some embodiments, the conductive element 24 may penetrate or fully penetrate the encapsulant 25. The conductive element 24 may include a conductive pillar (e.g., power pillar), conductive via, or other suitable components. In some embodiments, the conductive element 24 may be configured to provide a path for transmitting power from the carrier 10. The conductive element 24 may include a conductive material(s), such as copper (Cu), aluminum (Al), tungsten (W), titanium (Ti), tantalum (Ta), or other applicable materials. A surface 24*s*1 (or a top surface) of the conductive element 24 may be substantially aligned with a surface 23*s*1 (or a top surface) of the conductive element 23*a* (or 23*b*).

The encapsulant 25 may be disposed on or disposed over the carrier 10. In some embodiments, the encapsulant 25 may encapsulate the electronic component 21, the conductive elements 23*a* and 23*b*, and the conductive element 24. The encapsulant 25 may include insulation or dielectric material. For example, the encapsulant 25 may include a molding compound. In some embodiments, the encapsulant 25 may be made of molding material that may include, for example, a Novolac-based resin, an epoxy-based resin, a silicone-based resin, or other another suitable encapsulant. Suitable fillers may also be included, such as powdered $SiO_2$. The encapsulant 25 may have a surface 25*s*1 (or an upper surface) far away from the carrier 10. In some embodiments, the surface 25*s*1 of the encapsulant 25 may be substantially aligned with the upper surface of the conductive element 23*a* (or 23*b*). In some embodiments, the surface 25*s*1 of the encapsulant 25 may be substantially aligned with the upper surface of the conductive element 24.

In some embodiments, the bonding structure 30 (or a hybrid-bond structure) may be disposed on or disposed over the upper surface of the package structure 20. In some embodiments, the bonding structure 30 may be disposed on or disposed over the surface 25*s*1 of the encapsulant 25. The bonding structure 30 may be formed by a non-solder bonding technique, for example, a hybrid-bond technique. For example, the non-solder bonding technique may involve a bonding between metal (or alloy) materials (such as Cu to Cu bonding) and a bonding between dielectric materials (such as oxide to oxide bonding). In some embodiments, the bonding structure 30 may include pads 31*a*, 31*b*, 31*c*, and 31*d*, a dielectric layer 32, pads 33*a*, 33*b*, 33*c*, and 33*d*, and a dielectric layer 34. In some embodiments, the bonding structure 30 has no solder materials, such as tin or its derivatives.

The pads 31*a*, 31*b*, 31*c*, and 31*d* (or conductive elements) may be disposed within the dielectric layer 32 and located at the same level. The pads 31*a*, 31*b*, 31*c*, and 31*d* may be disposed on or disposed over the surface 25*s*1 of the encapsulant 25. The pads 31*a*, 31*b*, and 31*d* may protrude from the conductive elements 23*a*, 23*b*, and 23*d*. The pads 31*a* to 31*d* may be exposed by the encapsulant 25. The pad 31*a* may be electrically connected to the conductive element 23*a*. The pad 31*b* may be electrically connected to the conductive element 23*b*. The pad 31*c* may be electrically connected to the conductive element 24. The pad 31*d* may be electrically connected to the conductive element 23*d*. The pads 31*a*, 31*b*, 31*c*, and 31*d* may include a conductive material(s), such as copper (Cu), aluminum (Al), tungsten (W), titanium (Ti), tantalum (Ta), or other applicable materials. In some embodiments, the surface area of the pad 31*a* may be less than the surface area of the conductive element 23*a*. In other embodiments, the surface area of the pad 31*a* may be equal to the surface area of the conductive element 23*a*. In some embodiments, the surface area of the pad 31*c* may be less than the surface area of the conductive element 24. In other embodiments, the surface area of the pad 31*c* may be equal to the surface area of the conductive element 24.

The dielectric layer 32 (or a connection layer) may be disposed on or disposed over the package structure 20. The dielectric layer 32 may be disposed on or disposed over the surface 25*s*1 of the encapsulant 25. In some embodiments, the dielectric layer 32 may include an organic material, such as polyimide or other suitable materials. In some embodiments, the dielectric layer 32 may include an inorganic material, such as oxide, nitride, oxynitride, or other suitable materials.

The pads 33*a*, 33*b*, 33*c*, and 33*d* (or conductive elements) may be disposed within the dielectric layer 34 and located at the same level. The pads 33*a*, 33*b*, 33*c*, and 33*d* may be disposed on or disposed over the pads 31*a*, 31*b*, 31*c*, and 31*d*, respectively. The pad 33*a* may be electrically connected to the pad 31*a*. The pad 33*b* may be electrically connected to the pad 31*b*. The pad 33*c* may be electrically connected to the pad 31*c*. The material of the pads 33*a*, 33*b*, 33*c*, and 33*d* may be the same as or similar to that of the pad 31*a*. In some embodiments, the pad 31*a* (or 31*b* or 31*c* or 31*d*) may be substantially aligned with the pad 33*a* (or 33*b* or 33*c* or 33*d*). That is, the bonded surface of the pad 31*a* may be substantially completely bonded with that of the pad 33*a*. Each of the conductive element 23*a*, 23*b*, 23*d*, pads 31*a* to 31*d*, 33*a*-33*d*, or a combination thereof may be regarded as a conductive structure, and the conductive element 23*a*, 23*b*, 23*d*, pads 31*a* to 31*d*, 33*a*-33*d*, or a combination thereof may be regarded as a portion of said conductive structure.

The dielectric layer 34 (or a connection layer) may be disposed on or disposed over the dielectric layer 32. The material of the dielectric layer 34 may be the same as or similar to that of the dielectric layer 32. In some embodiments, a portion of the upper surface (not annotated) of the dielectric layer 32 may be exposed by the dielectric layer 34.

In some embodiments, the pads 31*a* and 33*a* may be regarded as an integral pad, as there is no boundary or a nonobvious boundary between the pads 31*a* and 33*a*. In some embodiments, the pads 31*b* and 33*b* may be regarded as an integral pad, as there is no boundary or a nonobvious boundary between the pads 31*b* and 33*b*. In some embodiments, the pads 31*c* and 33*c* may be regarded as an integral pad, as there is no boundary or a nonobvious boundary between the pads 31*c* and 33*c*. In some embodiments, there is no boundary or a nonobvious boundary between the dielectric layers 32 and 34.

In some embodiments, the electronic component 40 (or a power regulating component) may be disposed on or disposed over the bonding structure 30. The electronic component 40 may be configured to regulate power, such as a voltage and/or a current. The electronic component 40 may include a power regulating element, such as a voltage regulating element. The electronic component 40 may include a surface 40*s*1 (or a lower surface) and a surface 40*s*2 (or an upper surface) opposite to the surface 40*s*1. The surface 40*s*1 may face the package structure 20. Regulated power may be transmitted to the electronic component 21 through the surface 40*s*1 of the electronic component 40. A portion of the dielectric layer is not covered by the electronic component 40.

As shown in FIG. 1, a path P1 may indicate a transmission path of an electrical signal, such as power. In some embodiments, power may be transmitted from the carrier 10 to the electronic component 40 through the conductive element 24, the pads 31*c* and 33*c*, and the electronic component 40 as shown by the path P1. A path P2 may indicate a transmission path of an electrical signal, such as power. In some embodiments, power may be transmitted from the electronic component 40 to the electronic component 21 through the pads 33*a* and 31*a*, and the conductive element 23*a* as shown by the path P1. A path P3 may indicate a transmission path of an electrical signal which is electrically connected to the ground. For example, a grounding signal may be transmitted by the pads 31*b* and 33*b*. In some embodiments, electrical signal may be transmitted from the electronic component 40 to the pads 31*b* and 33*b*. In this embodiment, power may be transmitted through the backside surface (e.g., surface 21*s*2) of the electronic component 21. As a result, more signal input/output (I/O) terminals may be disposed over the surface 21*s*1 of the electronic component 21, which allows more signals (e.g., data signal) to be processed, input, and/or output.

In a comparative example, an electronic component is bonded to a package structure through a solder joint, which involves a reflow process configured to assist a solder material (e.g., tin or alloy including tin) to reach its eutectic temperature so that the solder material undergoes a phase change to a liquid or molten state. When the amount of the solder material is insufficient, a solder cracking may occur and cause an electrical disconnection between the electronic component and the package structure. Conversely, when the amount of the solder material is more than necessary, a solder bridging may occur and cause an electrical short. Further, it is a challenge to control the amount of the solder material as the size of an electronic device is reduced. In the embodiments of the present disclosure, the electronic component 40 may be bonded to the package structure 20 through a non-solder joint. More specifically, a hybrid-bond technique or a metal to metal bonding (e.g., copper to copper bonding) is utilized to bond the package structure 20 and the electronic component 40. In some embodiments, the pads 33*a*, 33*b*, 33*c*, and 33*d* are provided or formed on the surface 40*s*1 of the electronic component 40 and bonded to the pads 31*a*, 31*b*, 31*c*, and 31*d* through a hybrid-bond technique, which is performed at a temperature equal to or less than 200° C. Since the electronic component 40 and the package structure 20 are bonded by a non-solder joint, the aforesaid problems caused by using solder materials may be prevented. In some embodiments, when a reflow process is performed to joint other components, the pads 31*a*, 31*b*, 31*c*, 33*a*, 33*b*, and 33*c* are not reflowed. That is, each of the melting points of the pads 31*a*, 31*b*, 31*c*, 33*a*, 33*b*, and 33*c* is higher or greater than a temperature of a reflow process, such as 280° C., 270° C., 260° C., or fewer.

Figure 2:
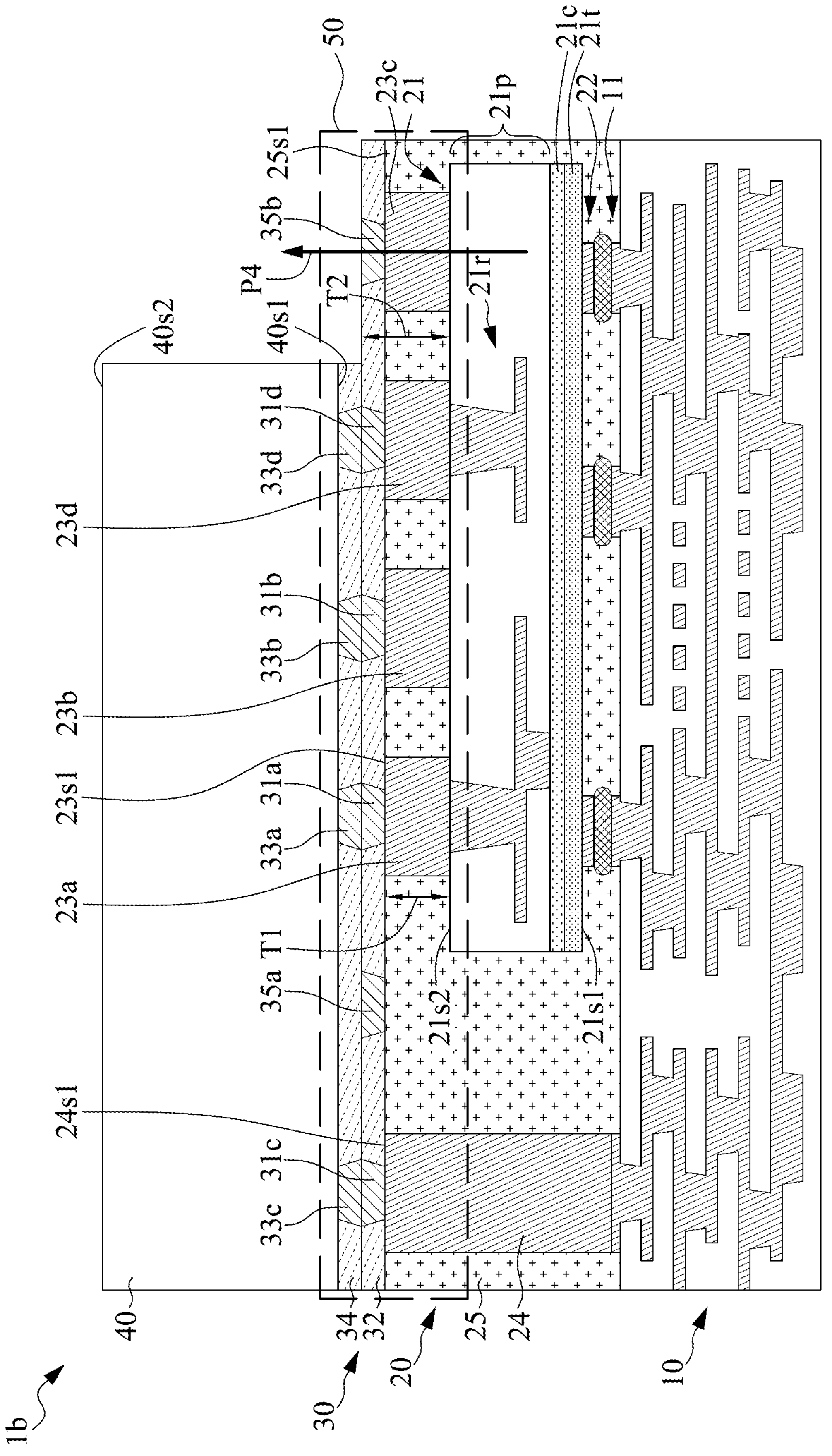
FIG. 2 illustrates a cross-sectional view of an example of an electronic device according to some embodiments of the present disclosure.

FIG. 2 illustrates a cross-sectional view of an example of an electronic device 1*b* according to some embodiments of the present disclosure. The electronic device 1*b* is similar to the electronic device 1*a* as shown in FIG. 1, and the differences therebetween are described below.

In some embodiments, the electronic device 1*b* may further include a conductive element 23*c*, a pad 35*a*, and a pad 35*b*. The conductive element 23*c* may be disposed on or disposed over the surface 21*s*2 of the electronic component 21. The conductive element 23*c* may be disposed within the encapsulant 25. The conductive element 23*c* may be connected to the pad 35*b*. In some embodiments, the conductive element 23*c* may be configured to transmit heat, emitted from the electronic component 21, to the outside of the package structure 20.

The pad 35*a* may be disposed on or disposed over the surface 25*s*1 of the encapsulant 25. The pad 35*a* may be disposed within the dielectric layer 32. The pad 35*a* may be configured to transmit heat, from the package structure 20, to the outside. The pad 35*b* may be disposed on or disposed over the surface 25*s*1 of the encapsulant 25. The pad 35*b* may be disposed within the dielectric layer 32. In some embodiments, the upper surface (not annotated) of the pad 35*b* may be exposed from the dielectric layer 32 or exposed to the air. The pad 35*b* may be connected to the conductive element 23*c*. The pad 35*b* may be configured to transmit heat, emitted from the electronic component 21, to the outside. In some embodiments, each of the pads 35*a* and 35*b* may function as a dummy pad, which is electrically isolated from the electronic component 40. In some embodiments, the pads 35*a* (or 35*b*) may be electrically isolated from the electronic component 21. The pad 35*b* is not covered by the electronic component 40. Each of the conductive element 23*c*, pads 35*a* and 35*b* may also be referred to as a heat dissipating structure. The pads 31*a*, 31*b*, and 31*d* may be interposed or disposed between the pads 35*a* and 35*b*. A path P4 may indicate a transmission path of heat. In some embodiments, heat may be transmitted from the electronic component 21 to the outside through the pad 35*a* (or 35*b*) as shown by the path P4. In some embodiments, a heat dissipating element (not shown), such as a heat sink, may be disposed over or connected to the pad 35*b*. which thereby facilitates the heat dissipation of the electronic device 1*b*.

In some embodiments, the conductive element 23*a*, conductive element 23*b*, and/or conductive element 24 may collectively function as a reinforcement structure 50. The reinforcement structure 50 may be disposed between the electronic component 40 and the electronic component 21. The reinforcement structure 50 may be configured to reduce a warpage of the electronic component 21, which enables the pads 31*a*, 31*b*, 31*c*, and 31*d* to be bonded and/or at least partially aligned with the pads 33*a*, 33*b*, 33*c*, and 33*d*, respectively. In some embodiments, the reinforcement structure 50 may include pads 35*a* and 35*b*. In some embodiments, the reinforcement structure 50 may have a thickness T1, which is defined by the conductive element 23*a*, and a thickness T2, which is defined by the conductive element 23*c* and the pad 35*b*, and which is different from the thickness T1.

Figure 3A:
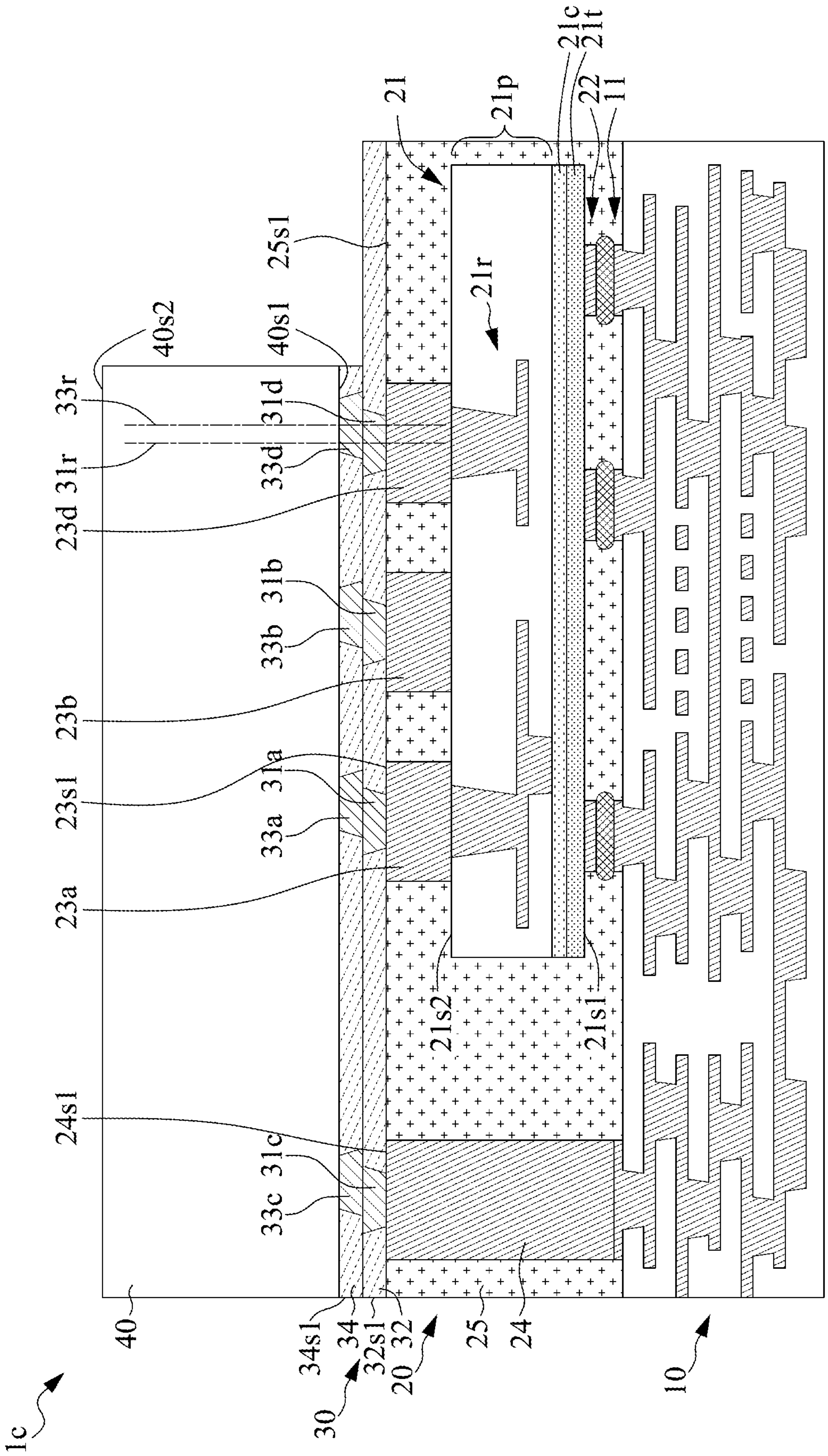
FIG. 3A illustrates a cross-sectional view of an example of an electronic device according to some embodiments of the present disclosure.

FIG. 3A illustrates a cross-sectional view of an example of an electronic device 1*c* according to some embodiments of the present disclosure. The electronic device 1*c* is similar to the electronic device 1*a* as shown in FIG. 1, and the differences therebetween are described below.

In some embodiments, the pad 31*a* may be at least partially misaligned with the pad 33*a*. In some embodiments, the pad 31*b* may be at least partially misaligned with the pad 33*b*. In some embodiments, the pad 31*c* may be at least partially misaligned with the pad 33*c*. A central axis 31*r* of the pad 31*d* (or 31*a* or 31*b* or 31*c*) may be misaligned with a central axis 33*r* of the pad 33*d* (or 33*a* or 33*b* or 33*c*). In some embodiments, a portion of the bonded surface of the pad 31*a* may be exposed from the pad 33*a*. In some embodiments, a portion of the bonded surface of the pad 31*a* may be in contact with the dielectric layer 34. In some embodiments, a lateral surface 34*s*1 (or a left side) of the dielectric layer 34 may be coplanar with a lateral surface 32*s*1 (or a left side) of the dielectric layer 32.

Figure 3B:
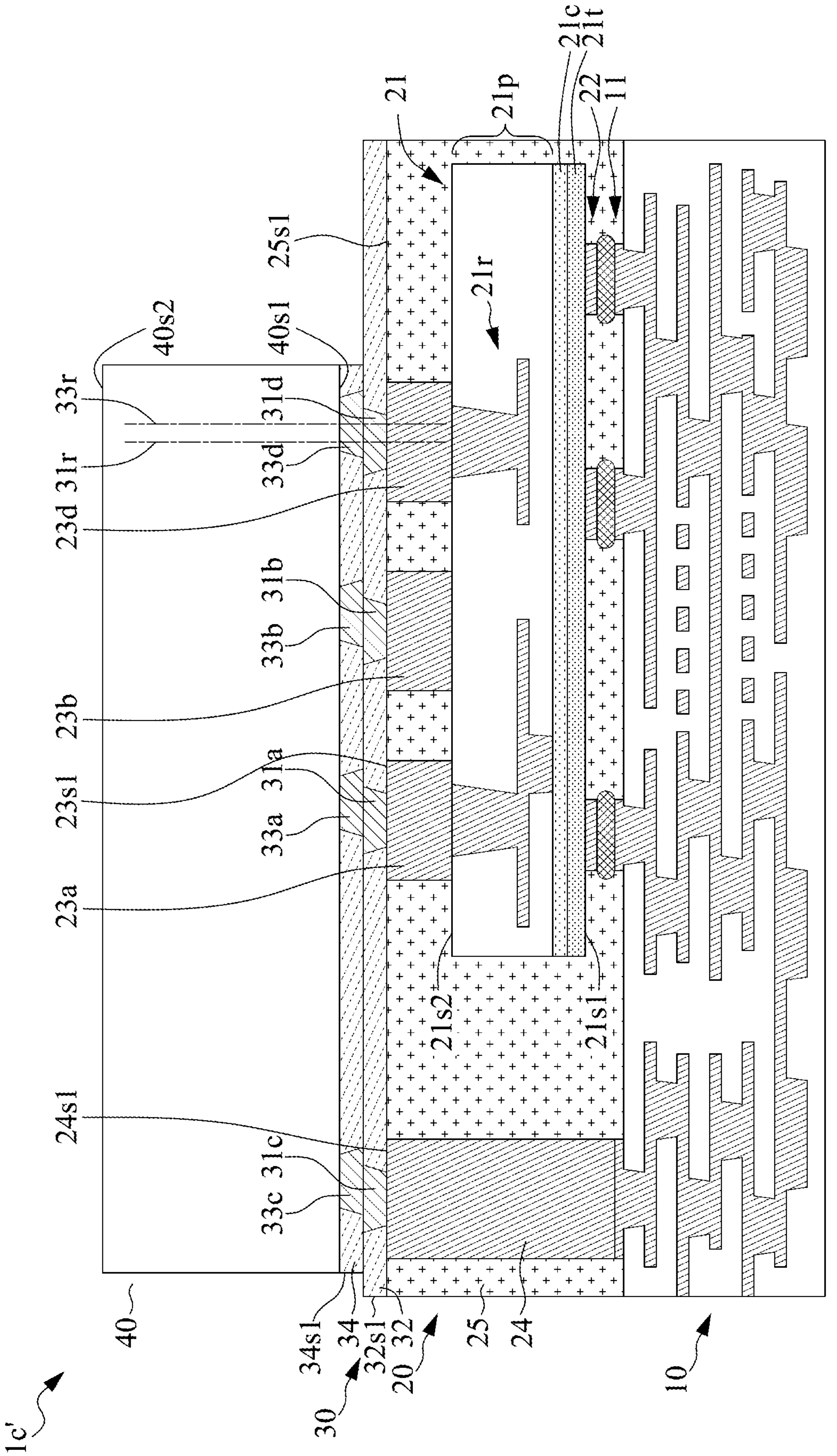
FIG. 3B illustrates a cross-sectional view of an example of an electronic device according to some embodiments of the present disclosure.

FIG. 3B illustrates a cross-sectional view of an example of an electronic device 1*c*' according to some embodiments of the present disclosure. The electronic device 1*c*' is similar to the electronic device 1*c* as shown in FIG. 3A, and the differences therebetween are described below. In some embodiments, the lateral surface 34*s*1 of the dielectric layer 34 may be misaligned with the lateral surface 32*s*1 of the dielectric layer 32. In this embodiment, the lateral surface 34*s*1 of the dielectric layer 34, the lateral surface 32*s*1 and the top surface (not annotated) of the dielectric layer 32 may define a stepped structure.

Figure 4A:
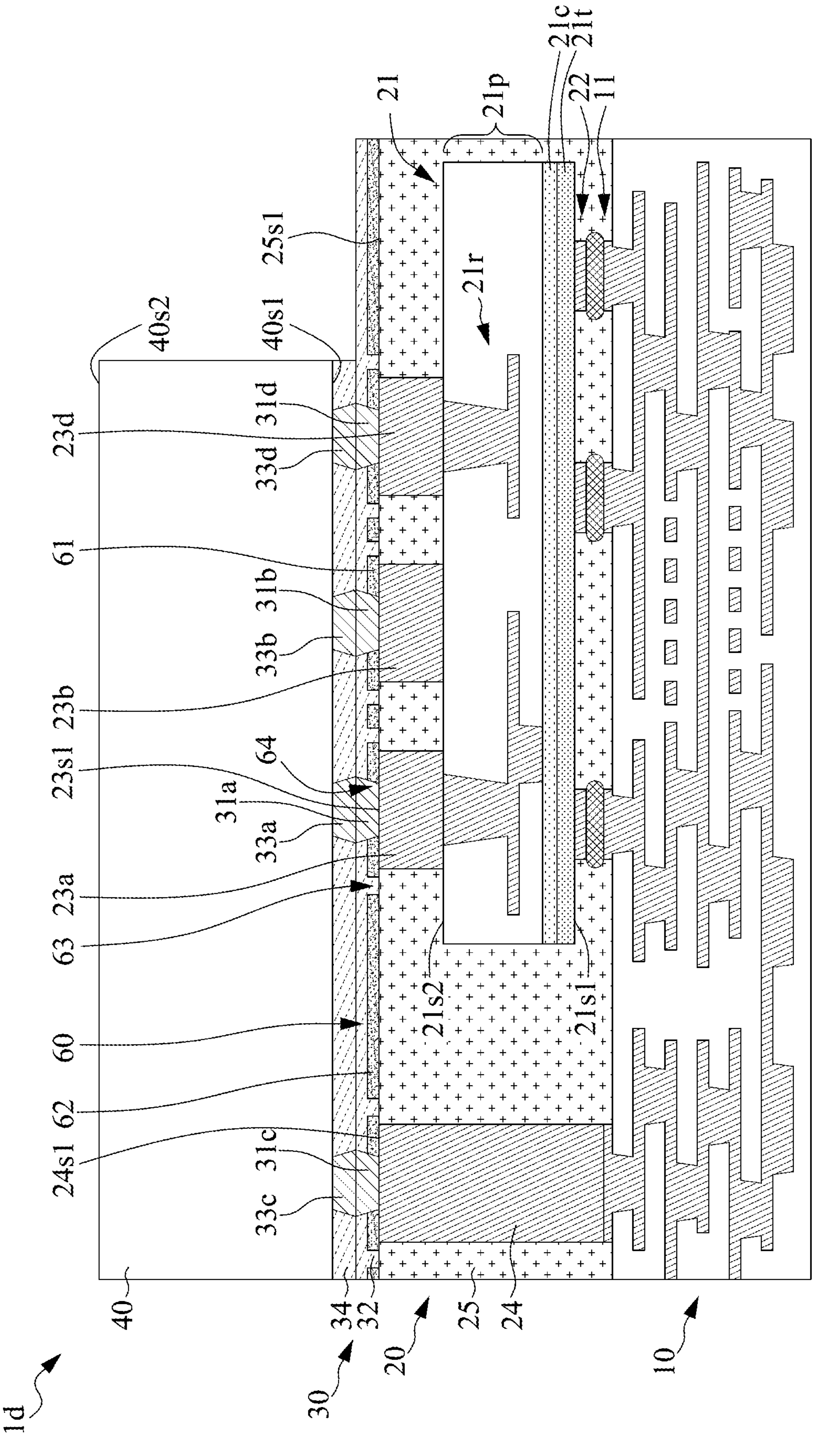
FIG. 4A illustrates a cross-sectional view of an example of an electronic device according to some embodiments of the present disclosure.

FIG. 4A illustrates a cross-sectional view of an example of an electronic device 1*d* according to some embodiments of the present disclosure. The electronic device 1*d* is similar to the electronic device 1*a* as shown in FIG. 1, and the differences therebetween are described below.

In some embodiments, the electronic device 1*d* may further include a conductive pattern 60. In some embodiments, the conductive pattern 60 may be disposed on or disposed over the package structure 20. In some embodiments, the conductive pattern 60 may be disposed on or disposed over the surface 25*s*1 of the encapsulant 25. In some embodiments, the conductive pattern 60 may abut, contact, and/or surround the bottom (not annotated) of the pads 31*a*, 31*b*, and/or 31*c*. In some embodiments, the conductive pattern 60 may include a conductive material(s), such as copper (Cu), aluminum (Al), tungsten (W), titanium (Ti), tantalum (Ta), or other applicable materials. In some embodiments, the conductive pattern 60 may define multiple openings. In some embodiments, the conductive pattern 60 may be configured to transmit heat or function as a part of a heat dissipating element. The conductive pattern 60 may be configured to increase the paths or areas for heat dissipating.

Figure 4B:
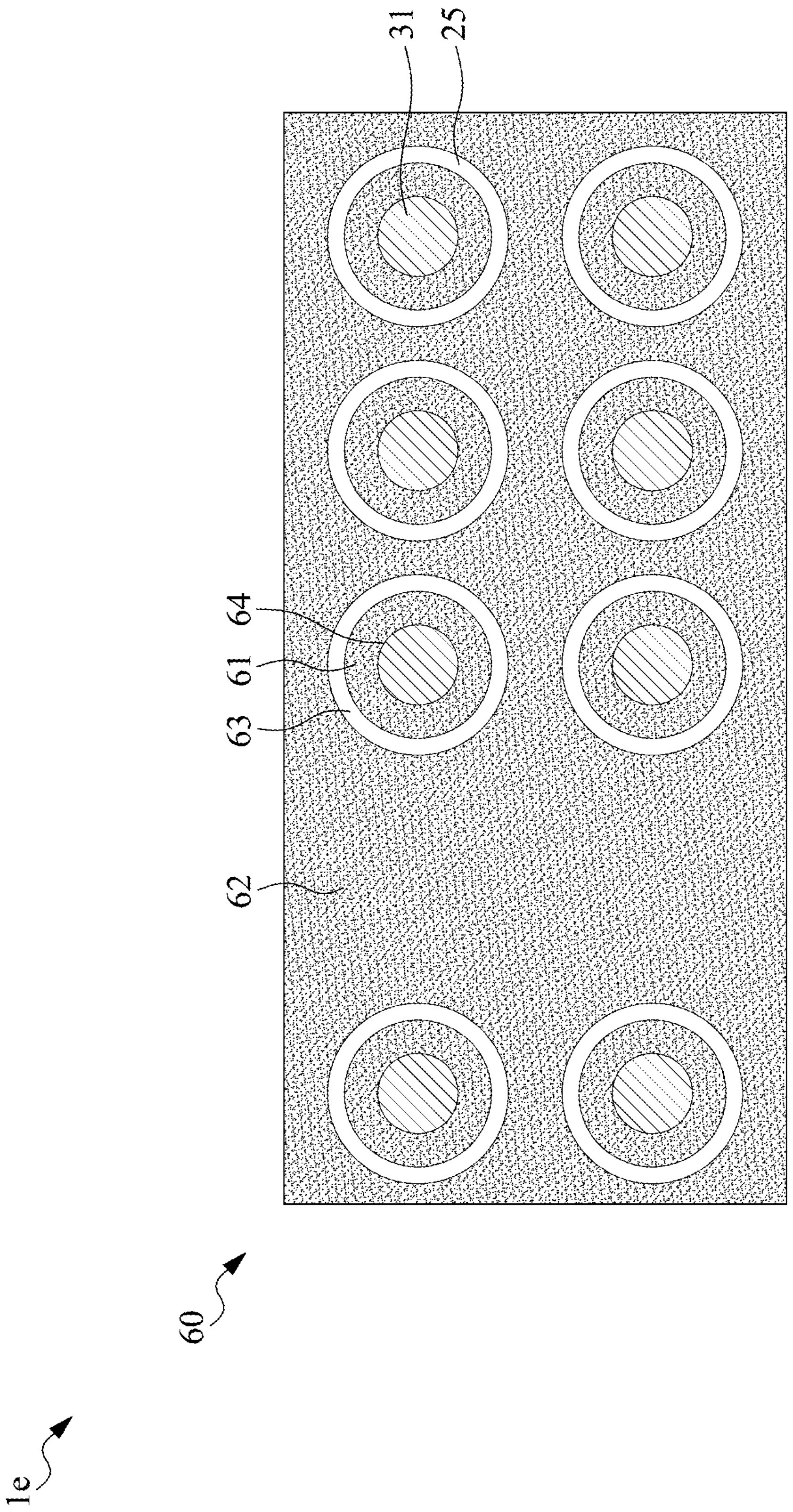
FIG. 4B illustrates a layout of an electronic device according to some embodiments of the present disclosure.

FIG. 4B illustrates a layout of an electronic device 1*e* according to some embodiments of the present disclosure. As shown in FIG. 4B, the conductive pattern 60 may include conductive portions 61, a conductive portion 62, and openings 63 and 64. The conductive portion 61 may be separated from the conductive portion 62 by the opening 63. The conductive portion 61 may be disposed between the openings 63 and 64. In some embodiments, each of pads 31, which may be the same as or similar to the pads 31*a*, 31*b*, 31*c*, and 31*d*, may penetrate the conductive portion 61. In some embodiments, each of the pads 31 may contact the conductive portion 61. The pad 31 may pass through the opening 64 defined by the conductive portion 61. In some embodiments, the conductive portion 61 may include a ring-shaped profile. The encapsulant 25 may be exposed by the opening 63. The opening 64 may have a circular profile, an elliptical profile, or other suitable profiles.

Refer back to FIG. 4A, the conductive portions 61 may be connected to the pads 31*a*, 31*b*, and 31*d*, which thereby decreases the impedance of the power delivery path. The conductive portions 61 may be configured to adjust the impedance of the power delivery path, and enhance the efficiency of the power transmission.

Figure 4C:
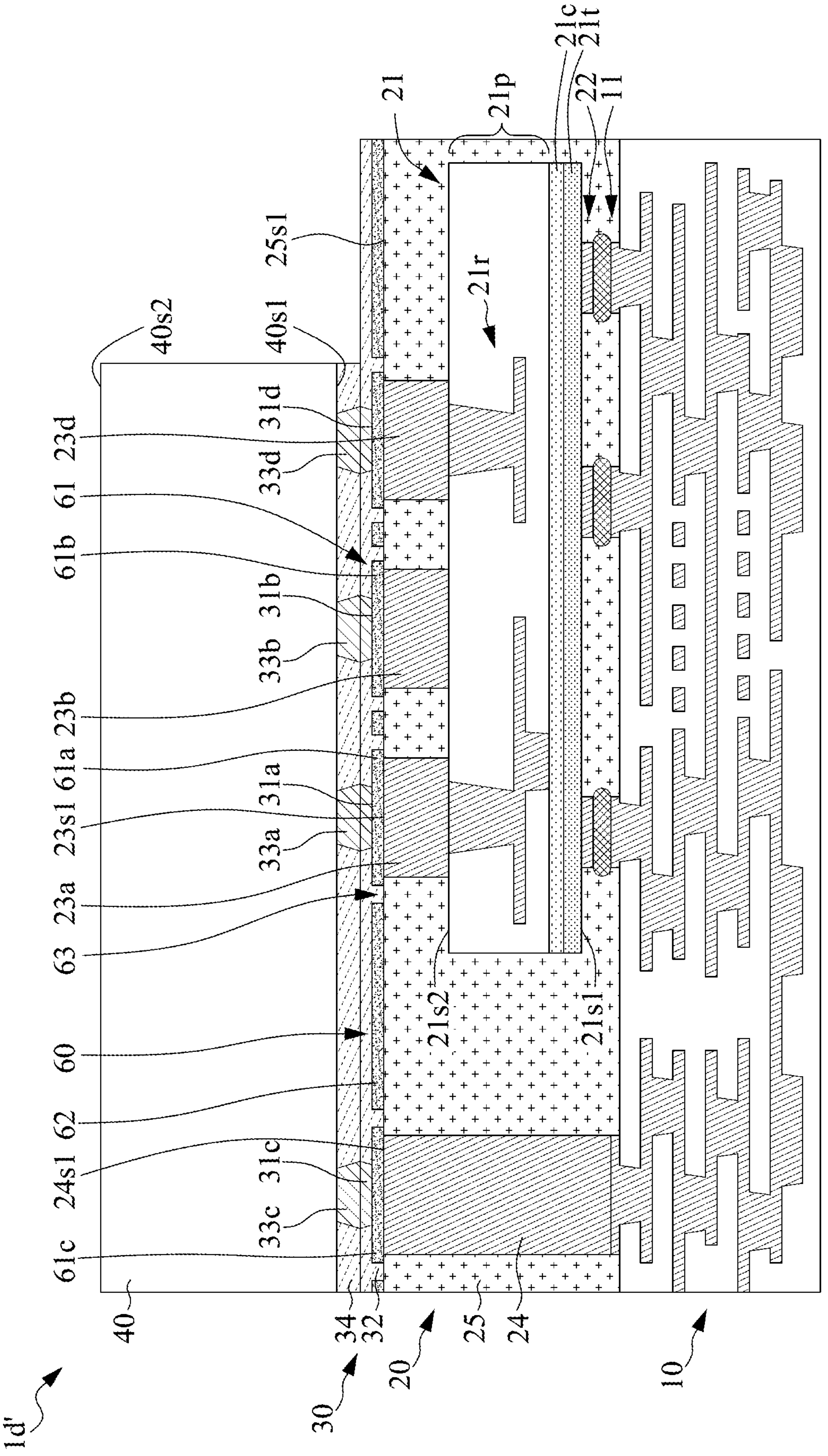
FIG. 4C illustrates a cross-sectional view of an example of an electronic device according to some embodiments of the present disclosure.

FIG. 4C illustrates a cross-sectional view of an example of an electronic device 1*d*' according to some embodiments of the present disclosure. The electronic device 1*d*' is similar to the electronic device 1*d* as shown in FIG. 4A, and the differences therebetween are described below. In some embodiments, the pads 31*a*, 31*b*, 31*c*, and 31*d* may be disposed over the conductive portions 61 of the conductive pattern 60. The conductive portions 61 may include parts 61*a*, 61*b*, and 61*c* separated from each other. The pads 31*a* to 31*c* may be disposed on or over the parts 61*a* to 61*c*.

Figure 5A:
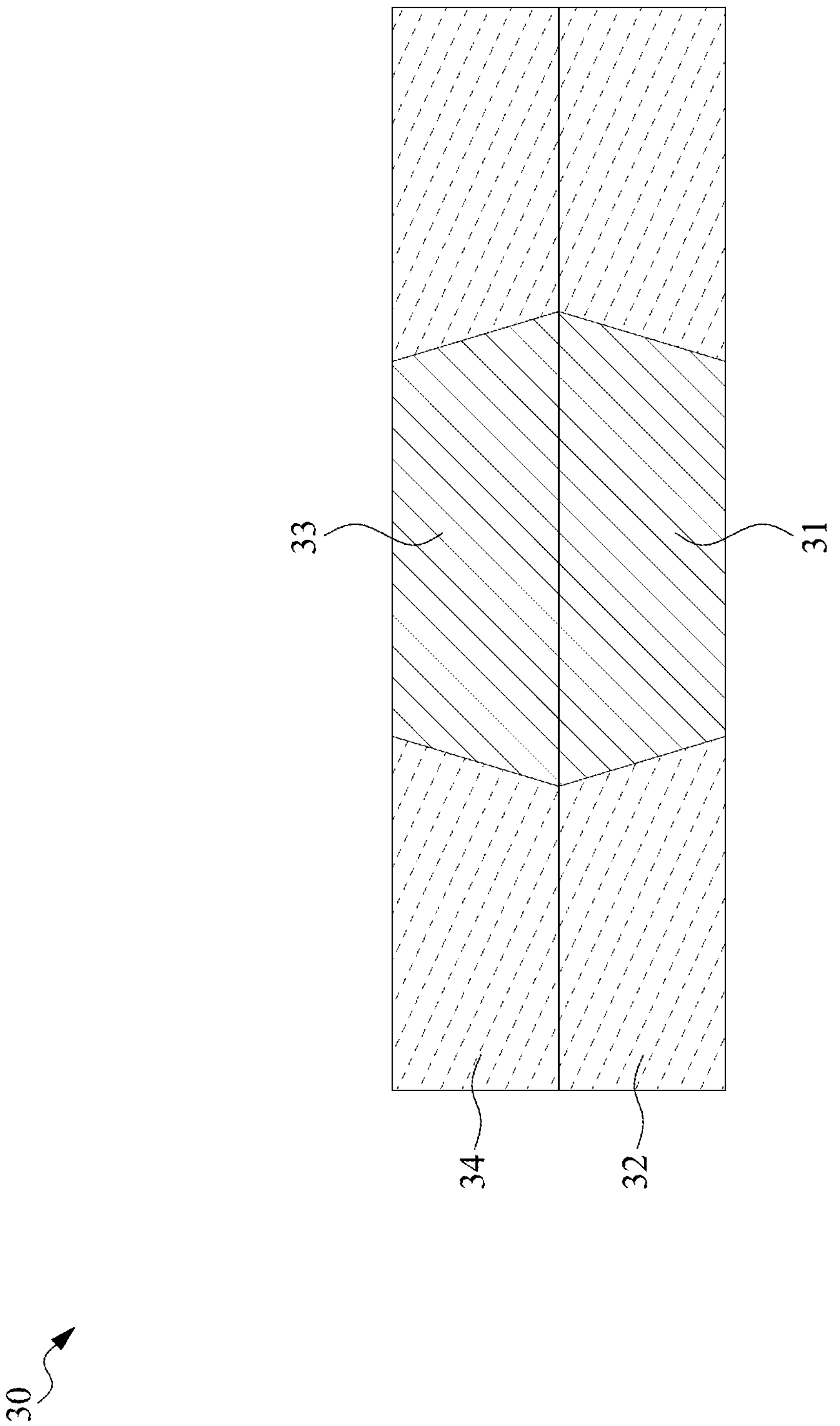
FIG. 5A is a partial enlarged view of an electronic device according to some embodiments of the present disclosure.

FIG. 5A is a partial enlarged view of an electronic device, such as the electronic device 1*a* as shown in FIG. 1, according to some embodiments of the present disclosure. In some embodiments, the pad 31 may be tapered along a direction far away from a pad 33, which may be the same as or similar to the pads 33*a*, 33*b*, 33*c*, and 33*d*. In some embodiments, the pad 33 may be tapered along a direction far away from the pad 31.

Figure 5B:
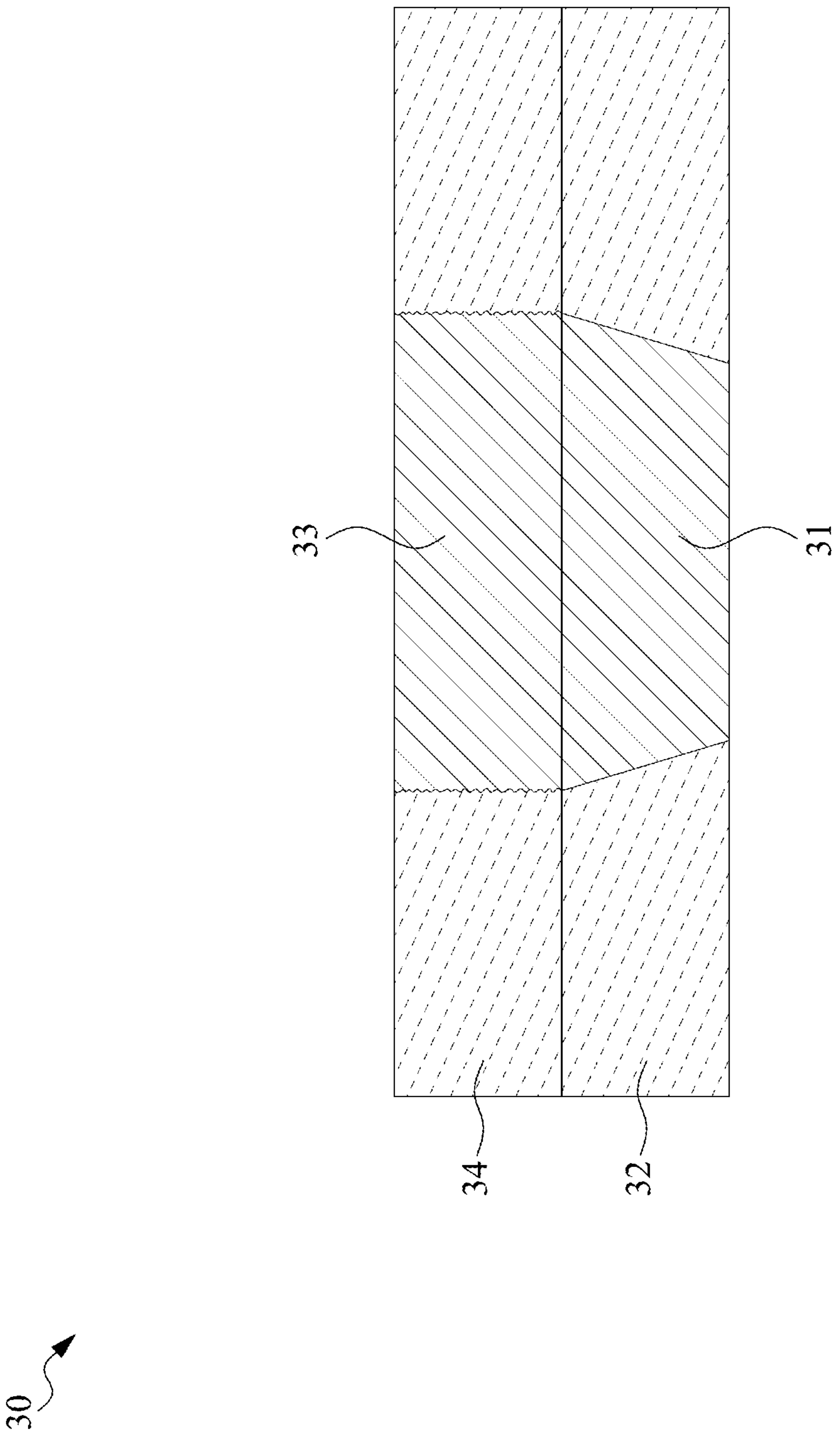
FIG. 5B is a partial enlarged view of an electronic device according to some embodiments of the present disclosure.

FIG. 5B is a partial enlarged view of an electronic device, such as the electronic device 1*a* as shown in FIG. 1, according to some embodiments of the present disclosure. In some embodiments, the pad 33 may have a substantially straight sidewall, which is substantially perpendicular to the upper surface (not annotated) of the dielectric layer 34. In some embodiments, the sidewall of the pad 33 may include a rough surface, which is formed due to a dry etching technique configured to remove the dielectric layer 34.

Figure 5C:
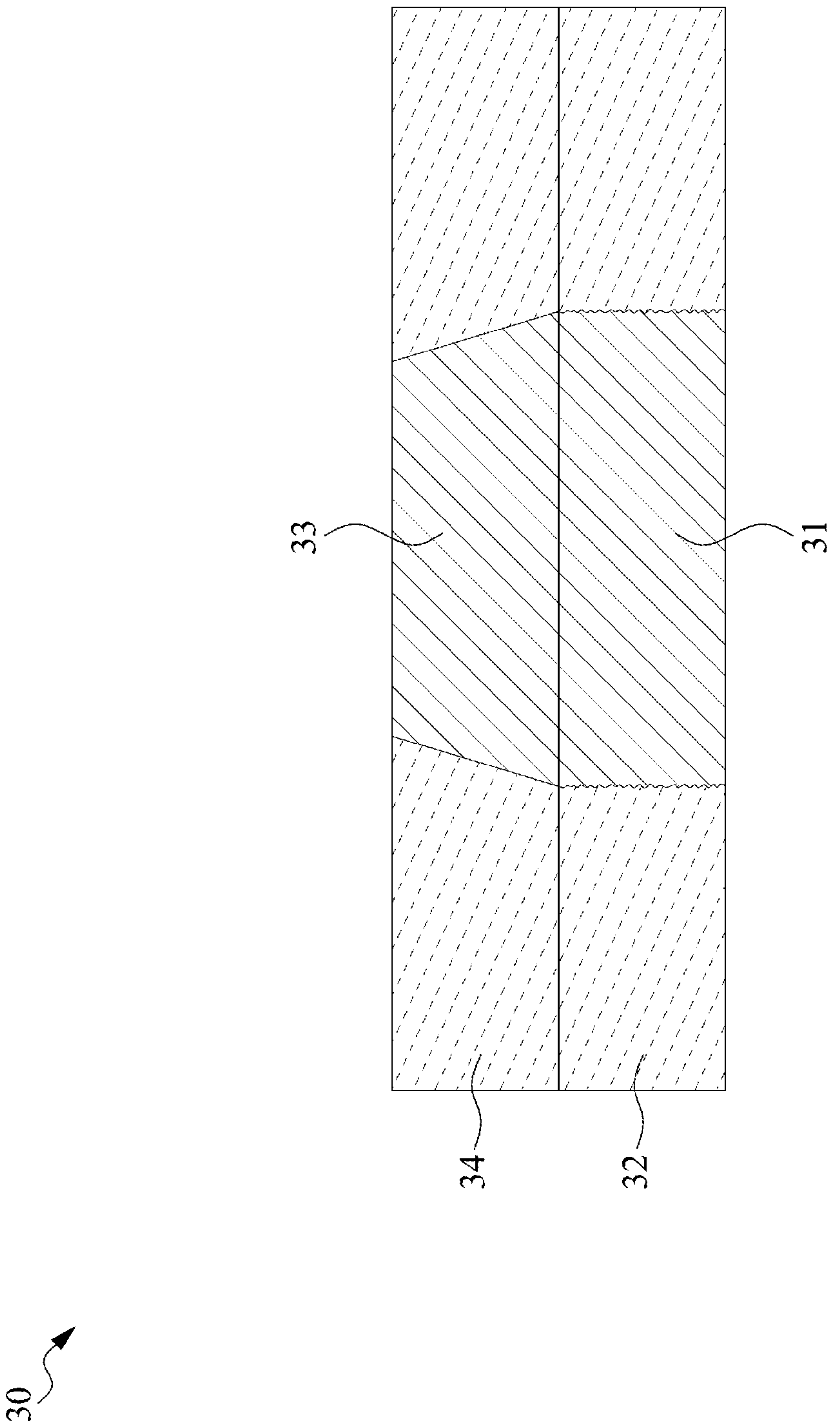
FIG. 5C is a partial enlarged view of an electronic device according to some embodiments of the present disclosure.

FIG. 5C is a partial enlarged view of an electronic device, such as the electronic device 1*a* as shown in FIG. 1, according to some embodiments of the present disclosure. In some embodiments, the pad 31 may have a substantially straight sidewall, which is substantially perpendicular to the lower surface (not annotated) of the dielectric layer 32. In some embodiments, the sidewall of the pad 31 may include a rough surface, which is formed due to a dry etching technique configured to remove the dielectric layer 32.

Figure 6:
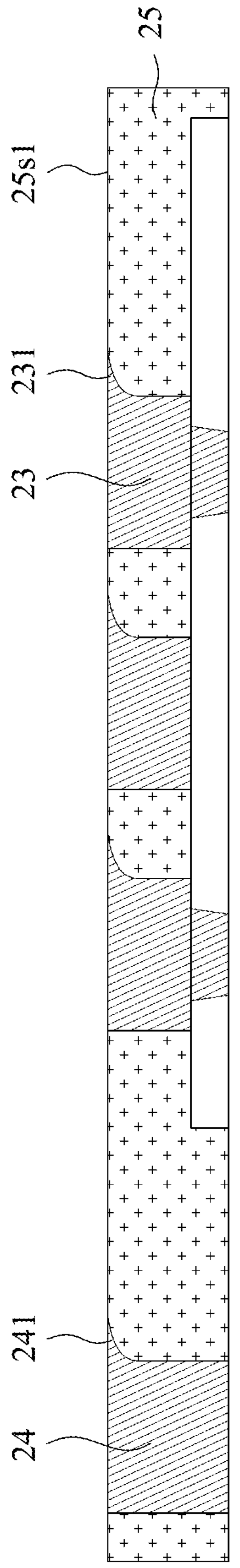
FIG. 6 is a partial enlarged view of an electronic device according to some embodiments of the present disclosure.

FIG. 6 is a partial enlarged view of an electronic device, such as the electronic device 1*a* as shown in FIG. 1, according to some embodiments of the present disclosure. In some embodiments, the conductive element 23 may have an extending portion 231 abutting the surface 25*s*1 of the encapsulant 25. In some embodiments, the conductive element 24 may have an extending portion 241 abutting the surface 25*s*1 of the encapsulant 25. The extending portions 231 and 241 may be formed due to a grinding technique performed on the conductive element 23, the conductive element 24, and the encapsulant 25. In some embodiments, the extending portion 231 may be protruded so that the boundary of the conductive element 23 may be discontinuous at the saddle point of the extending portion 231 from a top view.

FIG. 7A to FIG. 7J illustrate various stages of an example of a method for manufacturing an electronic device according to some embodiments of the present disclosure.

Figure 7A:
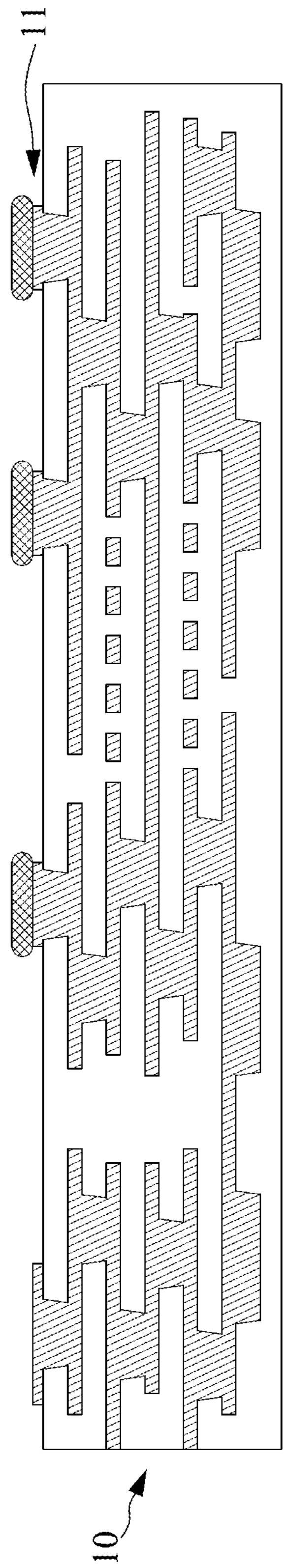
FIG. 7A illustrates one or more stages of an example of a method for manufacturing an electronic device according to some embodiments of the present disclosure.

Referring to FIG. 7A, a carrier 10 may be provided. A plurality of electrical connections 11 may be formed on the upper surface of the carrier 10.

Figure 7B:
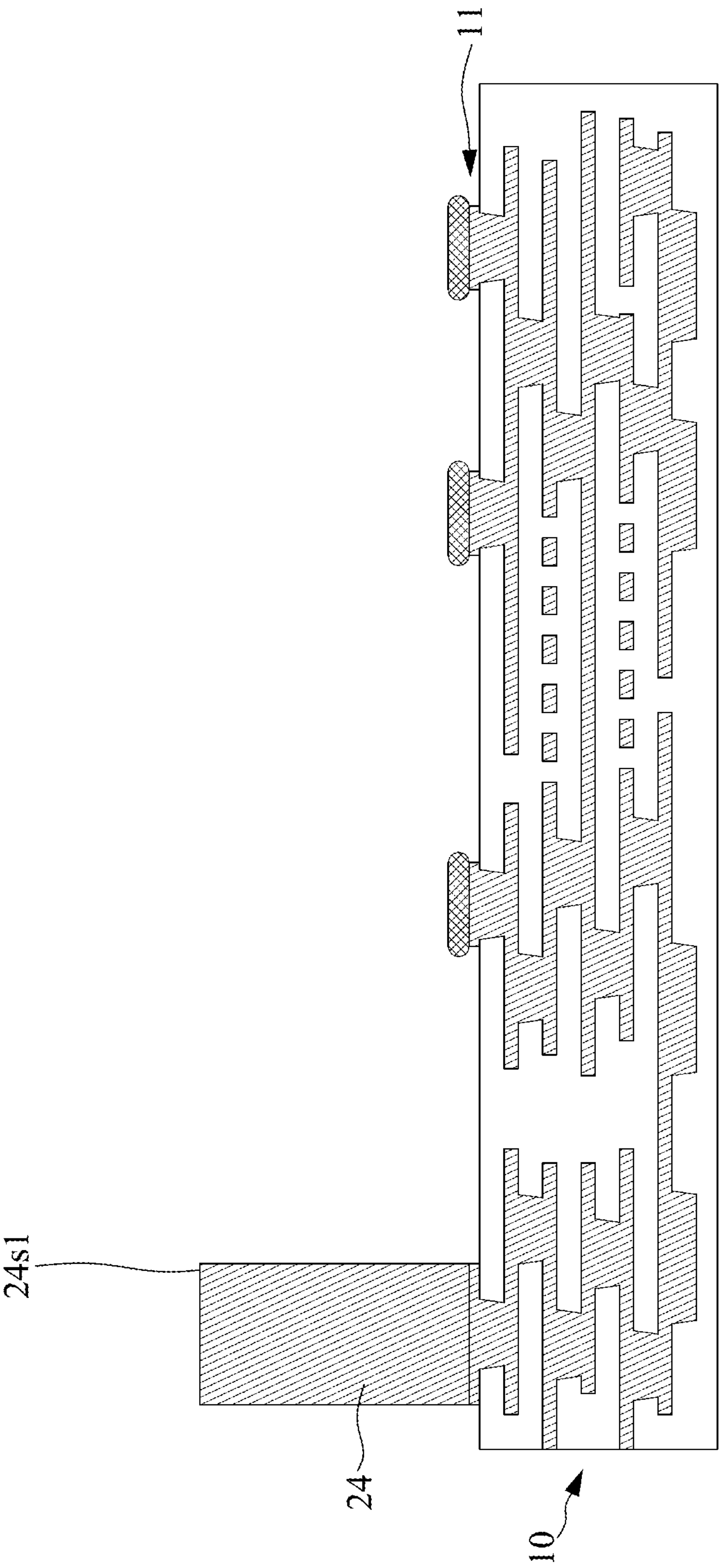
FIG. 7B illustrates one or more stages of an example of a method for manufacturing an electronic device according to some embodiments of the present disclosure.

Referring to FIG. 7B, a conductive element 24 may be formed on the upper surface of the carrier 10.

Figure 7C:
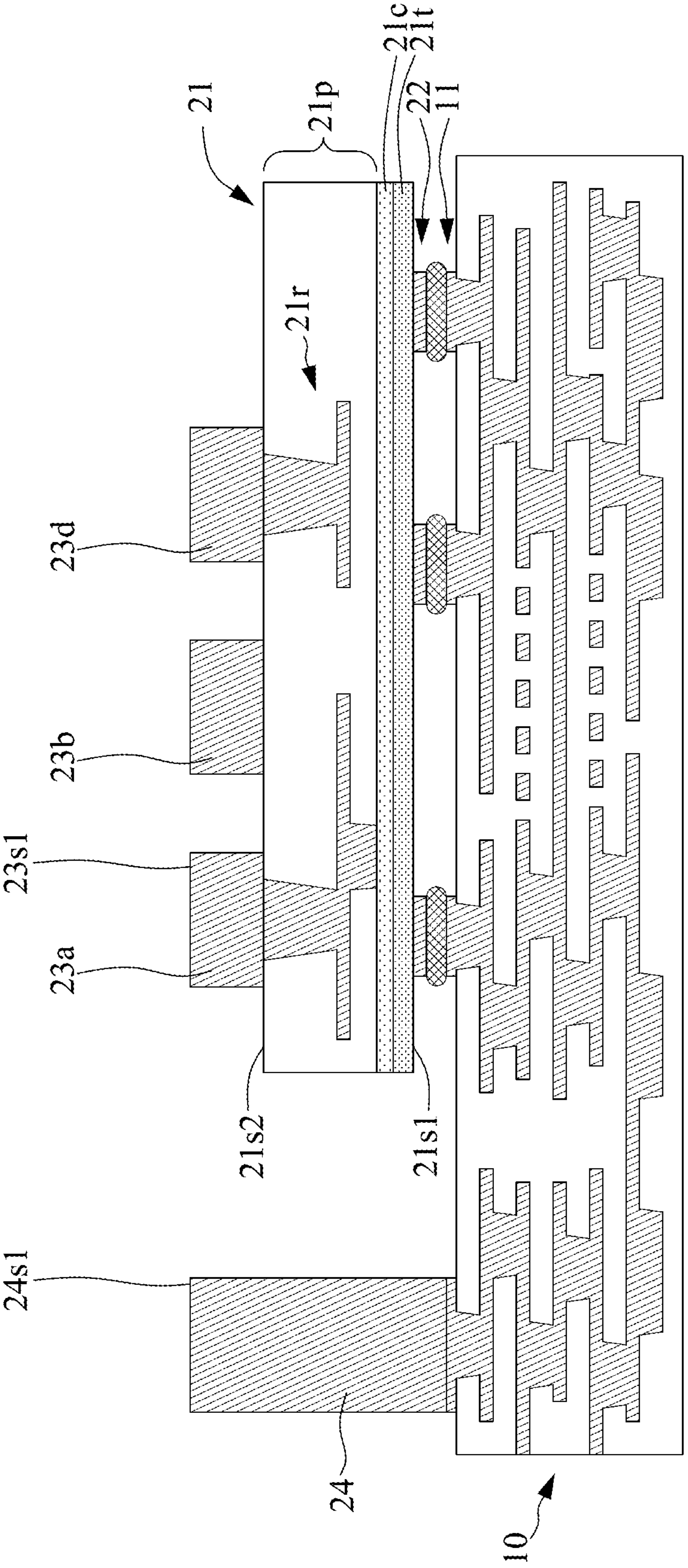
FIG. 7C illustrates one or more stages of an example of a method for manufacturing an electronic device according to some embodiments of the present disclosure.

Referring to FIG. 7C, an electronic component 21 may be provided. A plurality of electrical connections 22 may be formed on a surface 21*s*1 of the electronic component 21. Conductive elements 23*a* and 23*b* may be formed on a surface 21*s*2 of the electronic component 21. The electronic component 21 may be bonded to or attached to the carrier 10 by bonding the electrical connections 22 and 11.

Figure 7D:
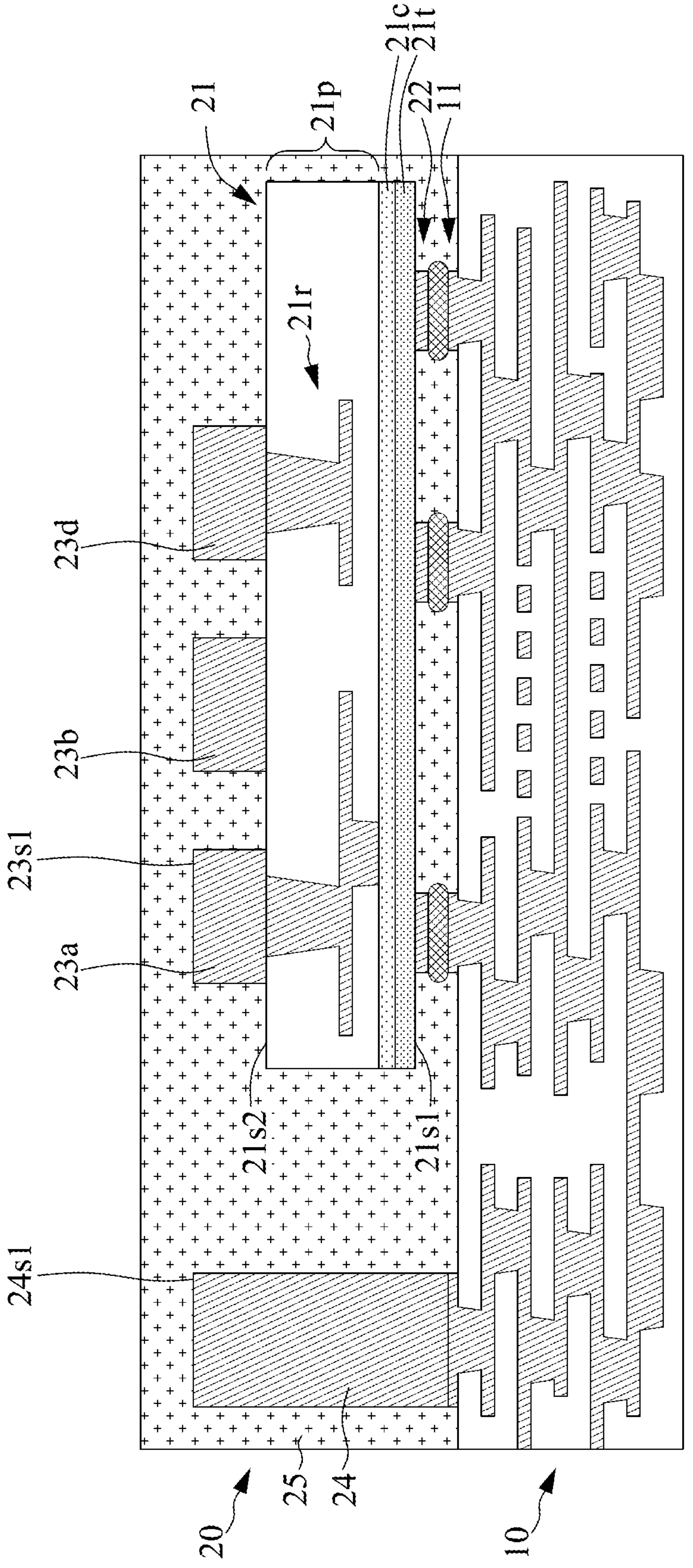
FIG. 7D illustrates one or more stages of an example of a method for manufacturing an electronic device according to some embodiments of the present disclosure.

Referring to FIG. 7D, an encapsulant 25 may be formed on the upper surface of the carrier 10. The encapsulant 25 may encapsulate the electronic component 21, and conductive element 23*a*, 23*b* and 24.

Figure 7E:
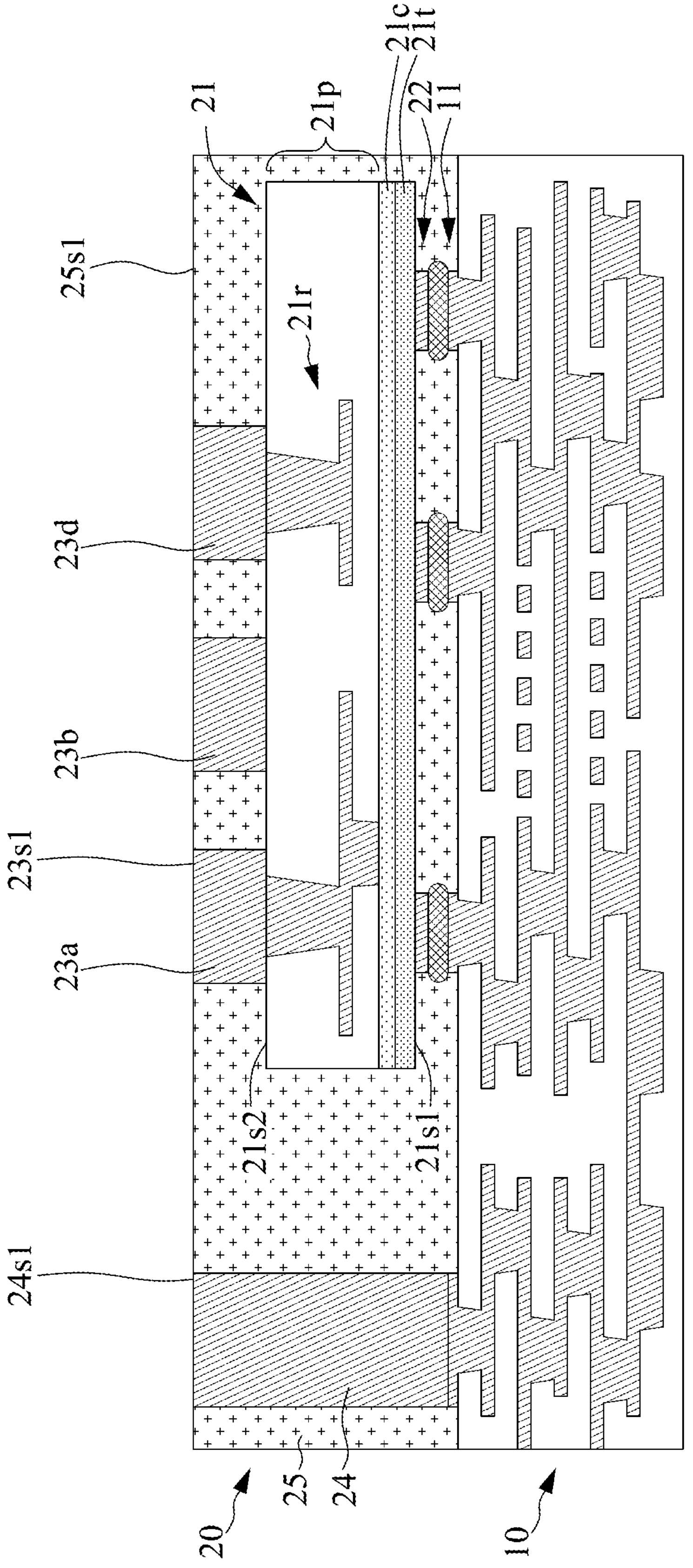
FIG. 7E illustrates one or more stages of an example of a method for manufacturing an electronic device according to some embodiments of the present disclosure.

Referring to FIG. 7E, a grinding technique may be performed on a surface 25*s*1 of the encapsulant 25. As a result, the surface 25*s*1 of the encapsulant 25 may be substantially aligned with the upper surfaces (not annotated) of the conductive elements 23*a*, 23*b*, and 24. Further, the extending portions (not shown) of the conductive elements

23*a*, 23*b*, and 24 may be formed adjacent to the surface 25*s*1 of the encapsulant 25. As a result, a package structure 20 may be produced.

Figure 7F:
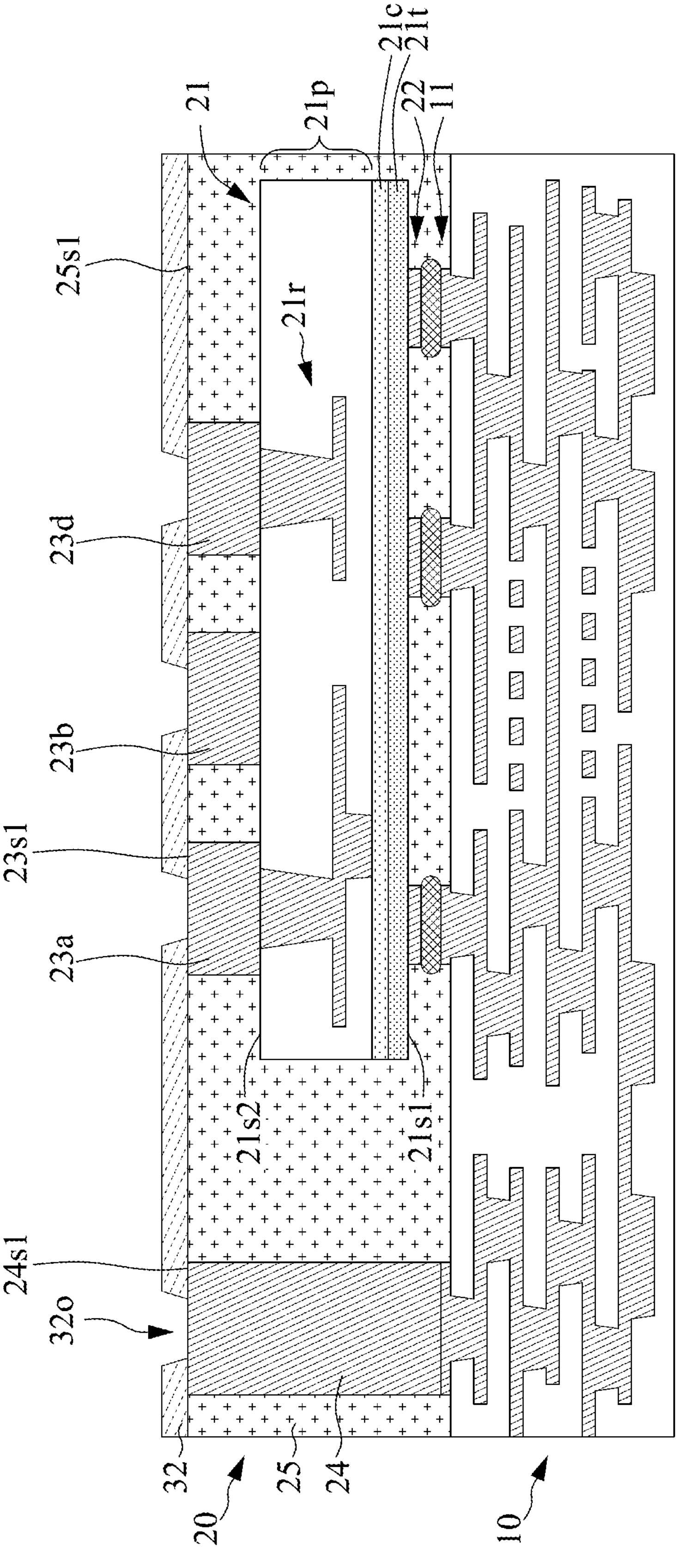
FIG. 7F illustrates one or more stages of an example of a method for manufacturing an electronic device according to some embodiments of the present disclosure.

Referring to FIG. 7F, a dielectric layer 32 may be formed on the surface 25*s*1 of the encapsulant 25. A plurality of openings 320 may be formed by, for example, an etching technique. The conductive elements 23*a*, 23*b*, and 24 may be exposed from the openings 320.

Figure 7G:
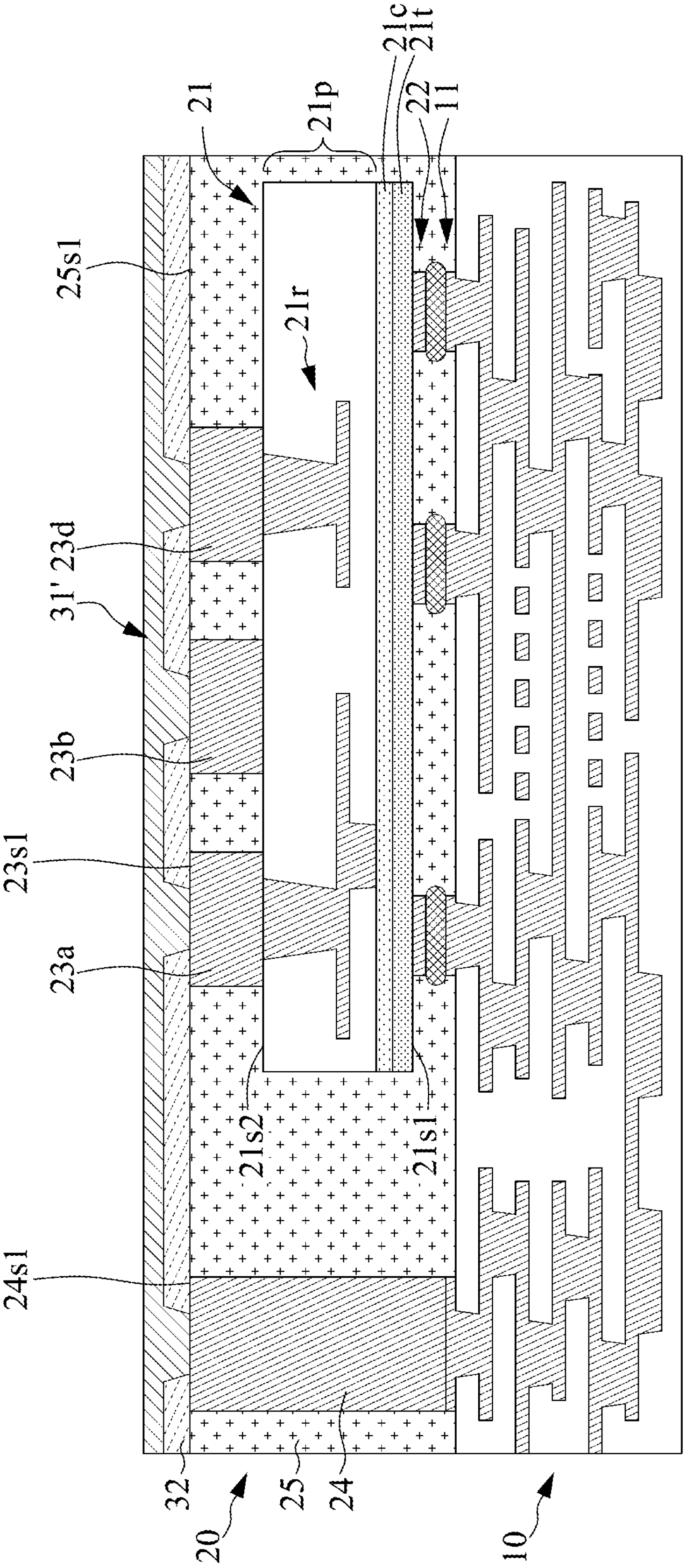
FIG. 7G illustrates one or more stages of an example of a method for manufacturing an electronic device according to some embodiments of the present disclosure.

Referring to FIG. 7G, a metallization layer 31' may be formed on the dielectric layer 32 and fill the openings 320.

Figure 7H:
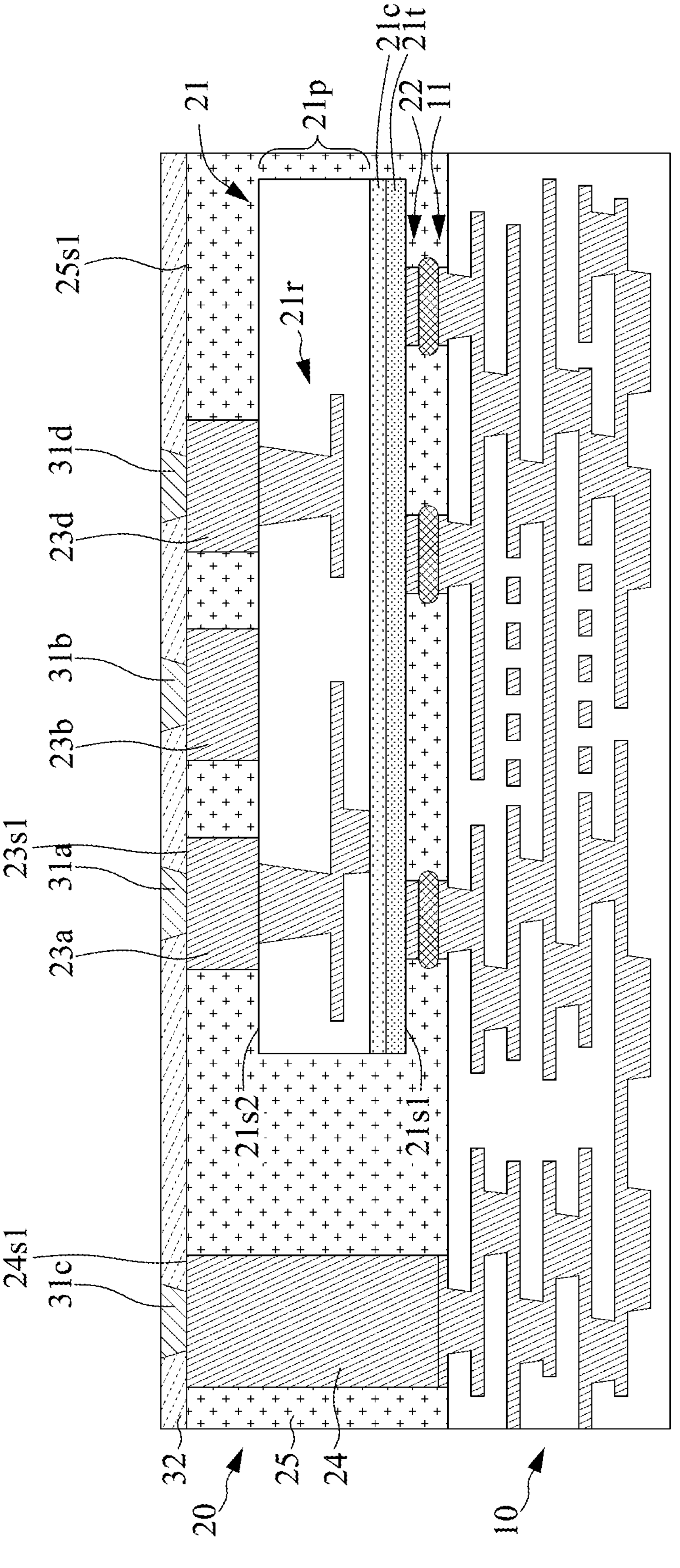
FIG. 7H illustrates one or more stages of an example of a method for manufacturing an electronic device according to some embodiments of the present disclosure.

Referring to FIG. 7H, a polishing technique may be performed to remove the excessive portion of the metallization layer 31' that is located over the upper surface of the dielectric layer 32. As a result, pads 31*a*, 31*b*, 31*c*, and 31*d* may be formed. It should be noted that the stages as shown in FIG. 7A to FIG. 7H illustrate a structure formed on a wafer, panel, or strip. That is, there are repeated units, each of which includes a corresponding package structure 20, connected to each other by the wafer, panel, or strip, and the structure as shown in FIG. 7A to FIG. 7H is one of the plurality of repeated units.

Figure 7I:
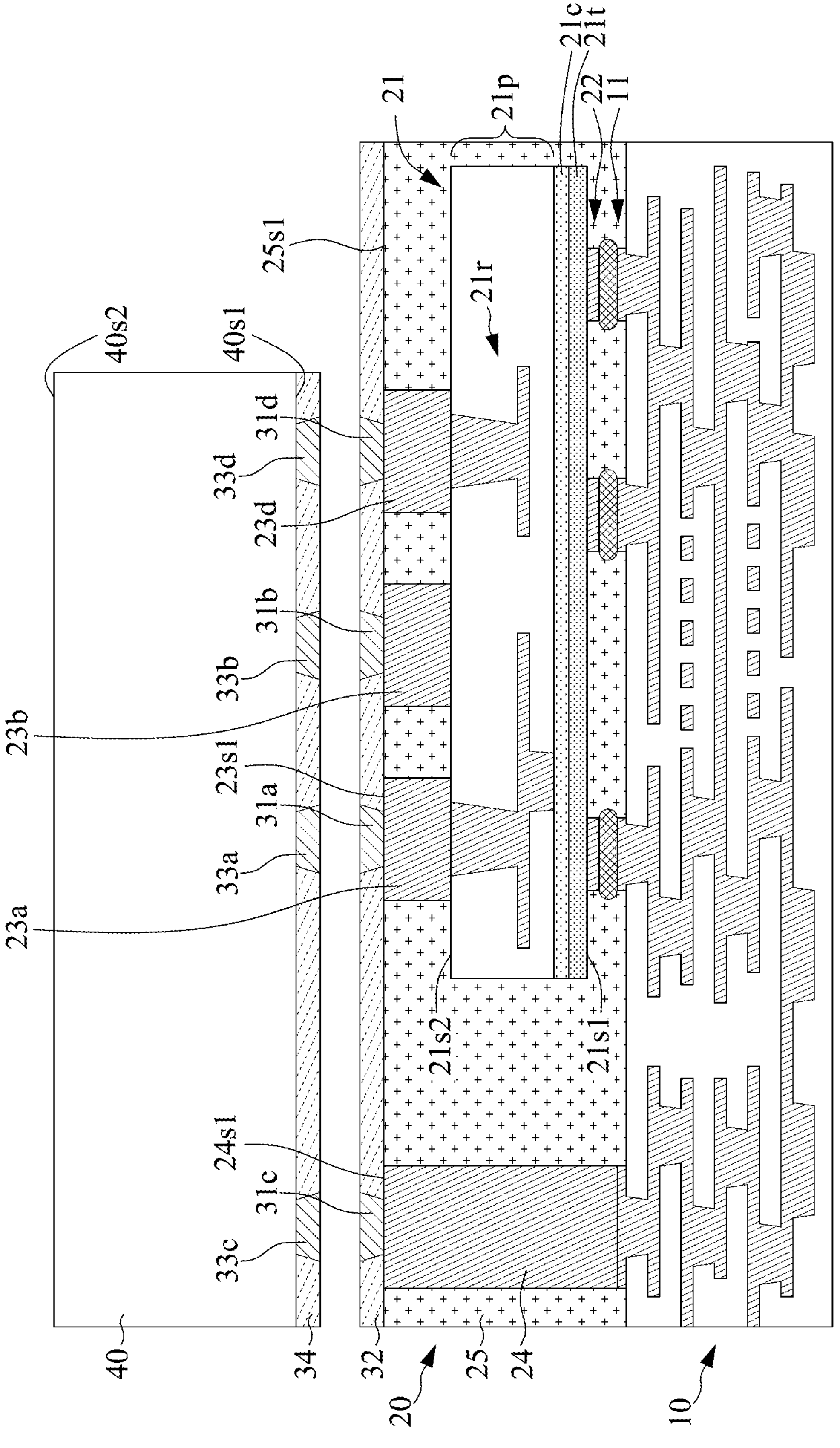
FIG. 7I illustrates one or more stages of an example of a method for manufacturing an electronic device according to some embodiments of the present disclosure.

Referring to FIG. 7I, an electronic component 40 may be provided. Pads 33*a*, 33*b*, 33*c*, and 33*d* as well as a dielectric layer 34 may be formed on or under a surface 40*s*1 of the electronic component 40. The electronic component 40 is a singulated unit. In this stage, multiple electronic components 40 may be mounted on or attached to a wafer structure (or a panel or a strip) which includes the carrier 10 and the package structure 20.

Figure 7J:
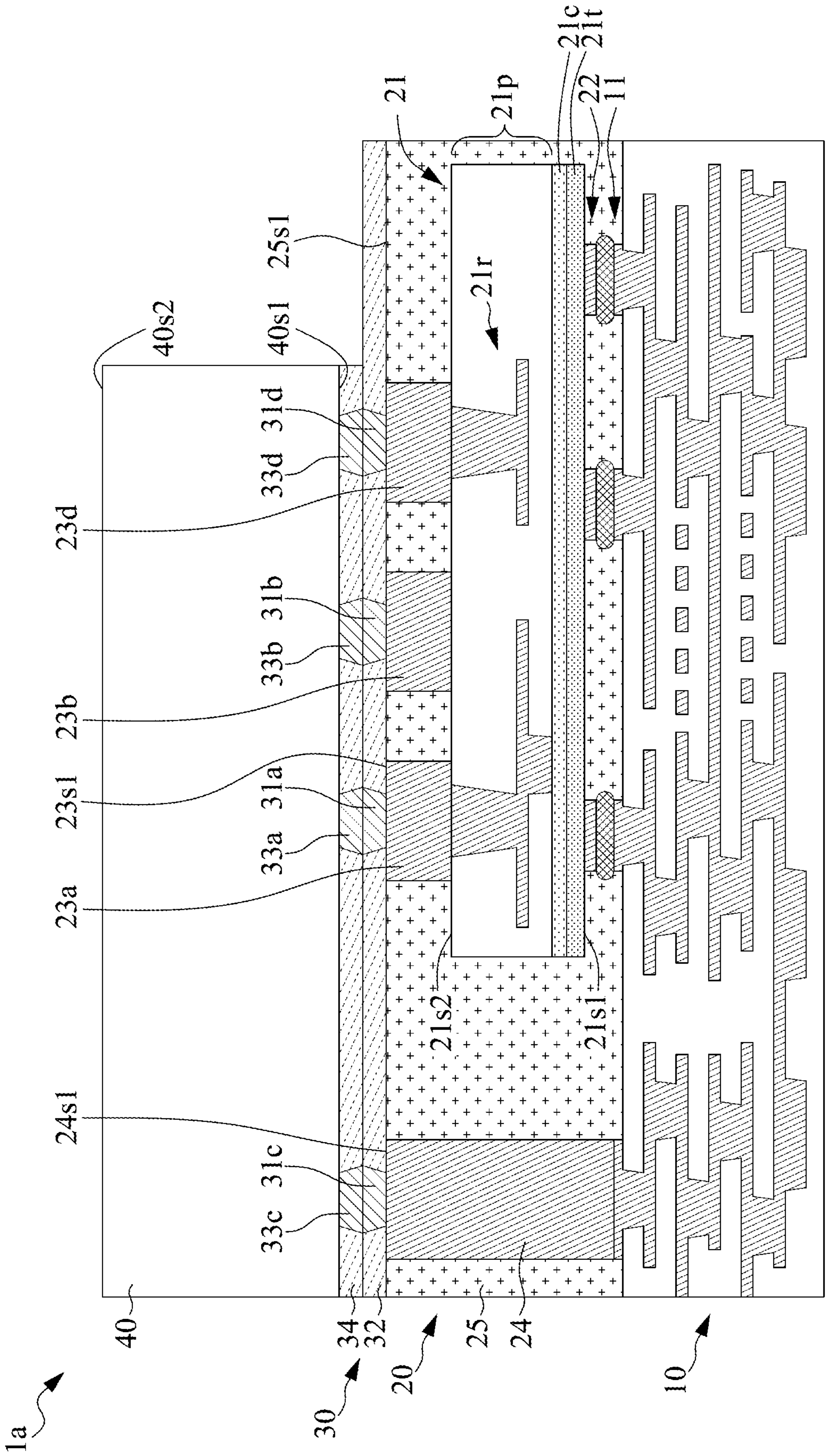
FIG. 7J illustrates one or more stages of an example of a method for manufacturing an electronic device according to some embodiments of the present disclosure.

Referring to FIG. 7J, the electronic component 40 may be bonded or attached to the package structure 20. Further, the plurality of repeated units on a wafer (or a panel or a strip) may be sawed, diced, or divided. As a result, an electronic device may be produced, such as the electronic device 1*a* as shown in FIG. 1. In some embodiments, a non-solder bonding technique, such as a hybrid-bond technique, may be performed to bond the package structure 20 and the electronic component 40. The pads 31*a*, 31*b*, 31*c*, and 31*d* may be bonded to the pads 33*a*, 33*b*, 33*c*, and 33*d*, respectively. The dielectric layer 32 may be bonded to the dielectric layer 34. At this stage, no solder material is utilized or reflowed. In this embodiment, a hybrid-bond technique is utilized, and therefore the issue of solder cracking and/or solder bridging may be prevented, which facilitates miniaturization of the electronic device 1*a*.

Figure 8A:
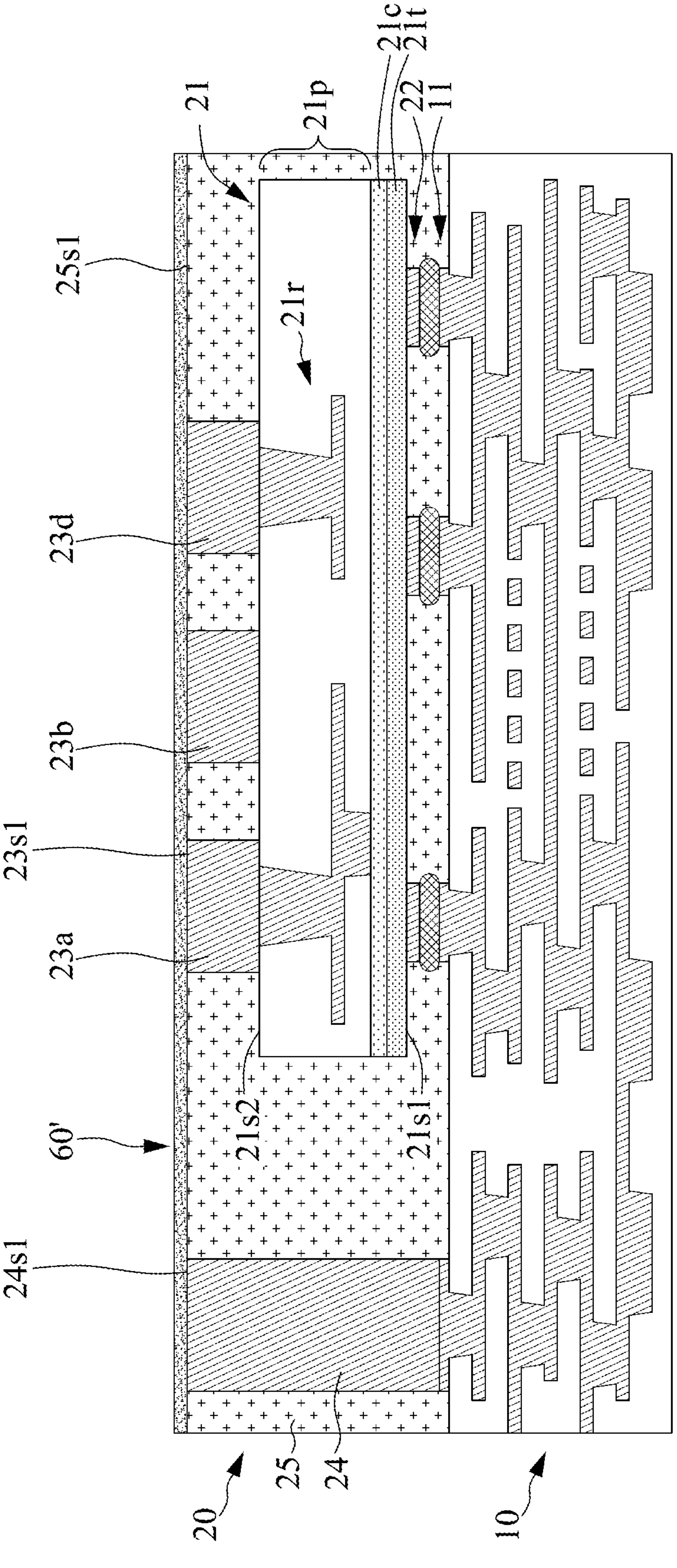
FIG. 8A illustrates one or more stages of an example of a method for manufacturing an electronic device according to some embodiments of the present disclosure.

FIG. 8A to FIG. 8D illustrate various stages of an example of a method for manufacturing an electronic device according to some embodiments of the present disclosure. The initial stage of the illustrated process is the same as, or similar to, the stage illustrated in FIG. 7A through FIG. 7E. FIG. 8A depicts a stage subsequent to that depicted in FIG. 7E.

Referring to FIG. 8A, a metallization layer 60' may be formed on the surface 25*s*1 of the encapsulant 25.

Figure 8B:
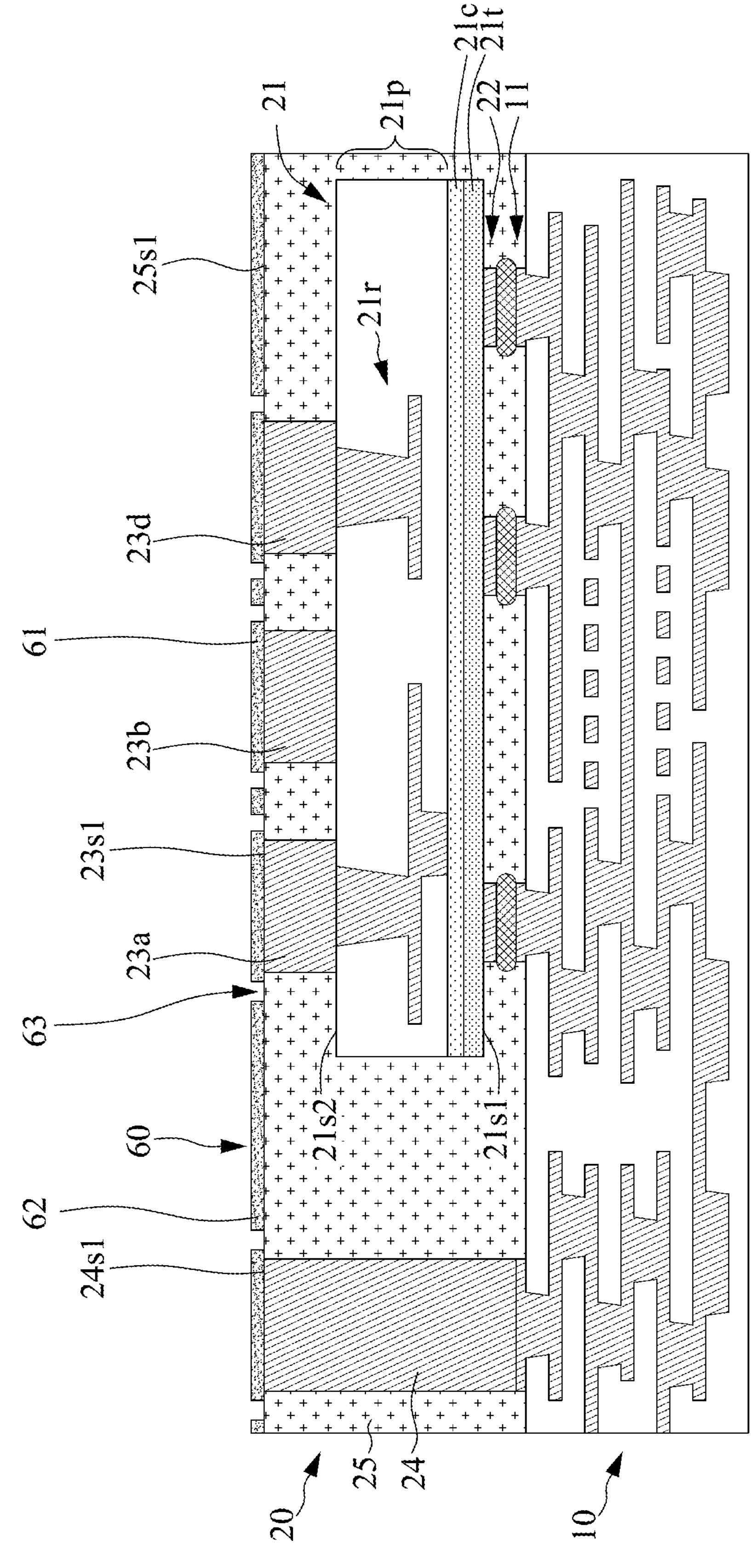
FIG. 8B illustrates one or more stages of an example of a method for manufacturing an electronic device according to some embodiments of the present disclosure.

Referring to FIG. 8B, the metallization layer 60' may be patterned to form the conductive pattern 60 that defines multiple openings.

Figure 8C:
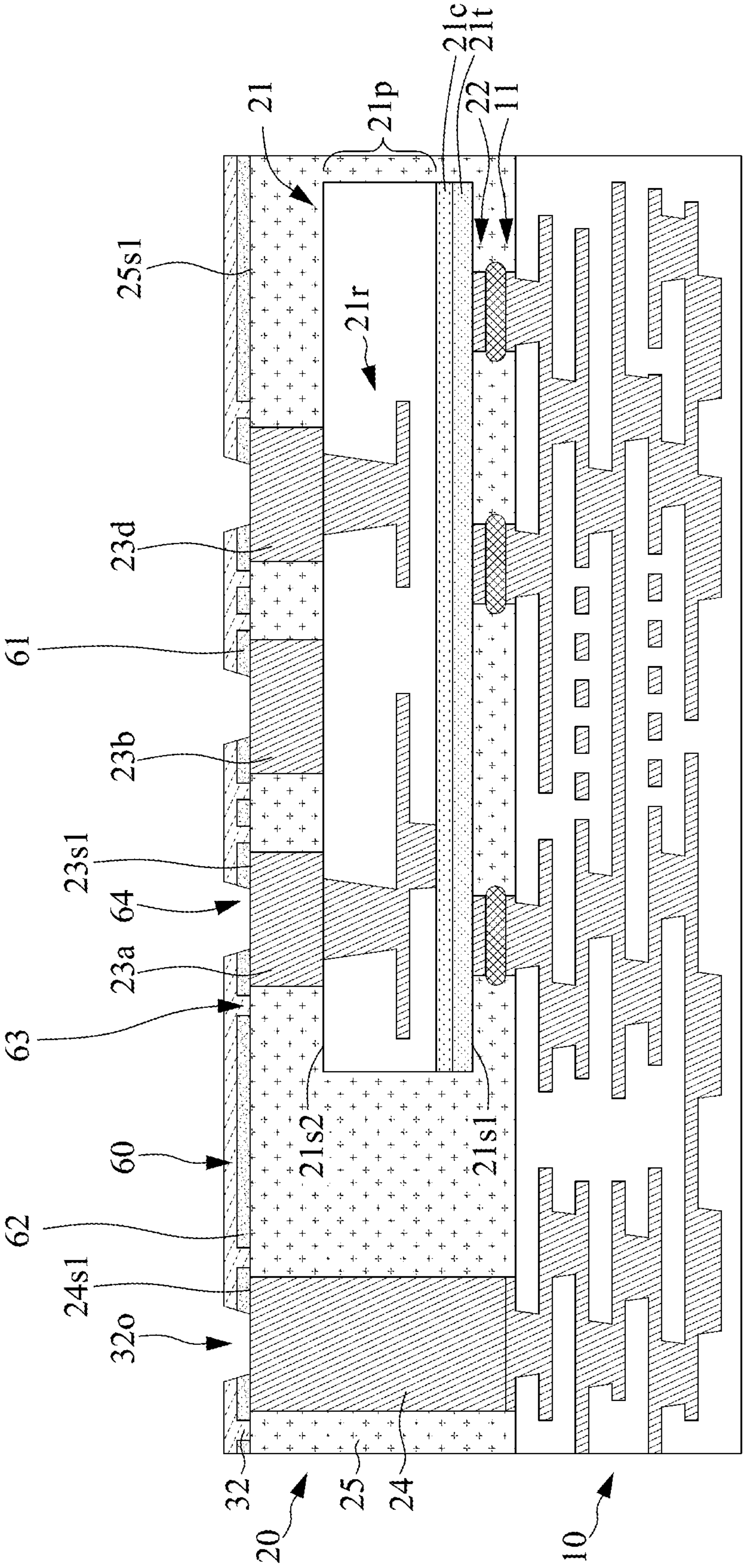
FIG. 8C illustrates one or more stages of an example of a method for manufacturing an electronic device according to some embodiments of the present disclosure.

Referring to FIG. 8C, the dielectric layer 32 may be formed on or formed over the conductive pattern 60. A plurality of the openings 320 may be formed.

Figure 8D:
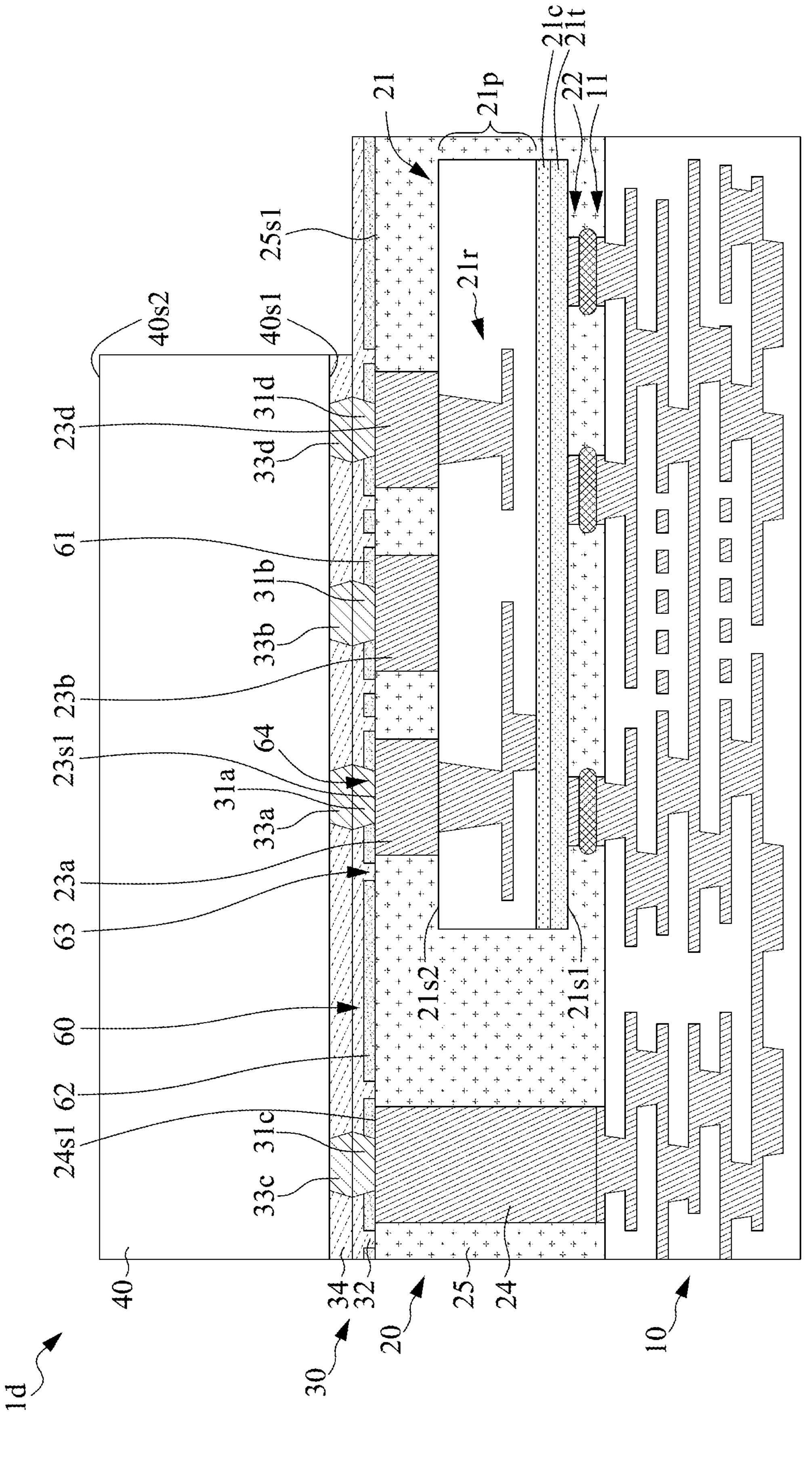
FIG. 8D illustrates one or more stages of an example of a method for manufacturing an electronic device according to some embodiments of the present disclosure.

Referring to FIG. 8D, the pads 31*a*, 31*b*, 31*c*, and 31*d* may be formed on or formed over the dielectric layer 32. The electronic component 40 may be attached to the package structure 20. As a result, an electronic device, such as the electronic device 1*d* as shown in FIG. 4A, may be produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of arrangements of this disclosure are not deviated from by such an arrangement.

As used herein the term "active surface" may refer to a surface of an electronic component or passive element on which contact terminals such as contact pads are disposed or a surface through which a signal passes.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces does not exceed 5 μm, does not exceed 2 μm, does not exceed 1 μm, or does not exceed 0.5 μm. A surface can be deemed to be substantially flat if a displacement between the highest point and the lowest point of the surface does not exceed 5 μm, does not exceed 2 μm, does not exceed 1 μm, or does not exceed 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
- a package structure comprising:
  - an electronic component;
  - a plurality of first conductive structures connected to the electronic component; and
  - an encapsulant encapsulating the electronic component and exposing a portion of the plurality of first conductive structures; and
- a power regulating component comprising a plurality of second conductive structures directly bonded with the plurality of first conductive structures and configured to provide the electronic component with a power signal, wherein at least one of the plurality of first conductive structures is configured to transmit a grounding signal between the electronic component and the power regulating component.

2. The electronic device of claim 1, wherein the electronic component has an active surface and a backside surface opposite to the active surface, and the backside surface of the electronic component is configured to allow the power signal to pass through.

3. The electronic device of claim 1, wherein each of the plurality of first conductive structures comprises a first portion within the encapsulant and a second portion protruding from the first portion, and the second portion is exposed by the encapsulant and connected to the plurality of second conductive structures.

4. The electronic device of claim 1, wherein the package structure comprises a plurality of first heat dissipating structures over the encapsulant and separated from the plurality of first conductive structures.

5. The electronic device of claim 4, wherein the package structure comprises a second heat dissipating structure within the encapsulant and connecting one of the plurality of first heat dissipating structures to the electronic component.

6. The electronic device of claim 4, wherein at least one of the plurality of first conductive structures is interposed between the plurality of first heat dissipating structures.

7. The electronic device of claim 4, wherein the package structure comprises a first connection layer covering the plurality of first conductive structures.

8. The electronic device of claim 7, wherein the power regulating component further comprises a second connection layer covering the plurality of second conductive structures, and at least one of the plurality of first heat dissipating structures is not covered by the second connection layer.

9. The electronic device of claim 7, wherein the power regulating component further comprises a second connection layer covering the plurality of second conductive structures and connected to the first connection layer.

10. The electronic device of claim 7, wherein a portion of the first connection layer and at least one of the plurality of first heat dissipating structures are not covered by the power regulating component.

11. An electronic device, comprising:
- a package structure comprising an encapsulant, an electronic component encapsulated by the encapsulant, and a first conductive element exposed by the encapsulant;
- an integrated circuit vertically on the package structure and comprising a second conductive element connected to the first conductive element through a non-solder joint, and
- a heat dissipating structure thermally connected to the electronic component, wherein the heat dissipating structure is electrically isolated from the first conductive element and laterally overlaps the first conductive element.

12. The electronic device of claim 11, wherein the electronic component comprises a redistribution circuit, a power delivery circuit closer to the integrated circuit than the redistribution circuit, and a logic circuit disposed between the redistribution circuit and the power delivery circuit, and wherein the electronic component is configured to receive a power from the integrated circuit through the power delivery circuit, the first conductive element, and the second conductive element.

13. The electronic device of claim 12, wherein the package structure comprises a third conductive element encapsulated by the encapsulant and connecting the power delivery circuit to the first conductive element.

14. The electronic device of claim 13, wherein the package structure comprises a fourth conductive element passing through the encapsulant and disposed adjacent to a lateral side surface of the electronic component, and wherein the integrated circuit is configured to receive the power through the fourth conductive element.

15. The electronic device of claim 11, wherein the electronic component has a first surface connected to a circuit structure through a solder-joint and a second surface opposite to the first surface and facing the integrated circuit.

16. An electronic device, comprising:
- a package structure comprising:
  - an electronic component;

a first conductive structure disposed over the electronic component; and a second conductive structure disposed adjacent to a lateral surface of the electronic component;

a second electronic component comprising a plurality of third conductive structures directly connected to the first conductive structure and the second conductive structure; and a heat dissipating structure disposed on the first conductive structure, wherein the heat dissipating structure laterally overlaps the plurality of third conductive structures.

17. The electronic device of claim 16, wherein a top surface of the first conductive structure is substantially aligned with a top surface of the second conductive structure.

* * * * *